United States Patent
Kim et al.

(10) Patent No.: US 9,728,497 B2
(45) Date of Patent: Aug. 8, 2017

(54) SEMICONDUCTOR DEVICE AND METHOD OF MANUFACTURING THE SAME

(71) Applicant: Samsung Electronics Co., Ltd., Suwon-si (KR)

(72) Inventors: Yu-duk Kim, Suwon-si (KR); Kyong-soon Cho, Incheon (KR); Shle-ge Lee, Seoul (KR); Da-hee Park, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/180,070

(22) Filed: Jun. 12, 2016

(65) Prior Publication Data

US 2017/0011992 A1    Jan. 12, 2017

(30) Foreign Application Priority Data

Jul. 10, 2015 (KR) .................. 10-2015-0098409

(51) Int. Cl.
| | |
|---|---|
| H01L 23/495 | (2006.01) |
| H01L 23/498 | (2006.01) |
| H01L 23/31 | (2006.01) |
| H01L 21/48 | (2006.01) |
| H01L 21/56 | (2006.01) |
| H01L 21/78 | (2006.01) |

(52) U.S. Cl.
CPC .... *H01L 23/49838* (2013.01); *H01L 21/4853* (2013.01); *H01L 21/565* (2013.01); *H01L 21/78* (2013.01); *H01L 23/3114* (2013.01); *H01L 23/49811* (2013.01); *H01L 2224/05554* (2013.01); *H01L 2224/48227* (2013.01); *H01L 2224/73265* (2013.01); *H01L 2924/15311* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 5,899,705 | A * | 5/1999 | Akram | H01L 23/13 257/E21.509 |
| 7,323,642 | B2 | 1/2008 | Hwang et al. | |
| 2007/0096249 | A1* | 5/2007 | Roeper | H01L 23/147 257/528 |

(Continued)

FOREIGN PATENT DOCUMENTS

| | | |
|---|---|---|
| JP | 09-162506 | 6/1997 |
| KR | 10-2007-0090327 A | 9/2007 |

(Continued)

*Primary Examiner* — Sitaramarao S Yechuri
(74) *Attorney, Agent, or Firm* — Muir Patent Law, PLLC

(57) ABSTRACT

A substrate structure may include a base substrate, a plurality of unit substrate regions arranged on the base substrate in one or more rows and one or more columns and spaced apart from one another, and dummy substrate regions between the unit substrate regions. In a row direction or a column direction, a first pitch between central points of two adjacent unit substrate regions among the unit substrate regions and a second pitch between central points of two adjacent second unit substrate regions among the unit substrate regions are different from each other.

19 Claims, 26 Drawing Sheets

(56) References Cited

U.S. PATENT DOCUMENTS

| | | | |
|---|---|---|---|
| 2008/0123300 A1* | 5/2008 | Tian | ........................ G11C 5/04 |
| | | | 361/721 |
| 2009/0166061 A1 | 7/2009 | Yoo et al. | |
| 2011/0007479 A1* | 1/2011 | Tam | .................... H01L 25/0652 |
| | | | 361/721 |
| 2011/0037155 A1* | 2/2011 | Pagaila | ................. H01L 21/561 |
| | | | 257/686 |
| 2013/0229778 A1 | 9/2013 | Ryou | |
| 2014/0268536 A1 | 9/2014 | Herman et al. | |

FOREIGN PATENT DOCUMENTS

| KR | 10-2012-0096345 | 8/2012 |
|---|---|---|
| KR | 10-2013-0104050 A | 9/2013 |

* cited by examiner

SEMICONDUCTOR DEVICE AND METHOD OF MANUFACTURING THE SAME

CROSS-REFERENCE TO RELATED APPLICATION

This application claims priority under 35 U.S.C. §119 to Korean Patent Application No. 10-2015-0098409, filed on Jul. 10, 2015, in the Korean Intellectual Property Office, the disclosure of which is incorporated herein in its entirety by reference.

BACKGROUND

The present disclosure relates to a substrate structure, and more particularly, to a substrate structure used in the manufacture of an electronic component such as a semiconductor package or a semiconductor chip.

A substrate structure such as a printed circuit board (PCB) or a wafer may be used by dividing the same into a plurality of unit substrate regions. A semiconductor chip is mounted in each of unit substrate regions of a PCB, and various processes such as a wire bonding process, a molding process, and a solder attachment process may be performed thereon to manufacture a semiconductor package. In regard to a wafer, a transistor forming process, a capacitor forming process, and a wiring process and the like may be performed on unit substrate regions on the wafer to manufacture a semiconductor chip.

When manufacturing a semiconductor package or a semiconductor chip on a substrate structure, warpage of the substrate structure which refers to bending of the substrate structure may be caused due to a difference in coefficients of thermal expansion (CTE) between respective elements of the semiconductor package or the semiconductor chip.

SUMMARY

The present disclosure provides a substrate structure that is capable of reducing warpage and includes a plurality of unit substrate regions.

The present disclosure also provides a method of manufacturing a semiconductor device including a unit substrate region.

According to example embodiments, there is provided a substrate structure including: a base substrate; a plurality of unit substrate regions arranged on the base substrate in one or more rows and one or more columns and spaced apart from one another; and dummy substrate regions between the unit substrate regions, wherein in a row direction or a column direction, a first pitch between central points of two adjacent first unit substrate regions among the unit substrate regions and a second pitch between central points of two adjacent second unit substrate regions among the unit substrate regions are different from each other.

The unit substrate regions are aligned in at least one of the row direction and the column direction, and a plurality of strips formed of the unit substrate regions are spaced apart from one another in at least one of the row direction and the column direction, wherein pitches between central points of the unit substrate regions are different according to the strips.

The pitches between central points of the unit substrate regions in the plurality of strips may have a first pitch and a second pitch greater than the first pitch, and the first pitch may be repeated in at least a first strip and the second pitch may be repeated in at least a second strip.

In the at least one of the strips, pitches between the central points of the unit substrate regions may be different in at least one of the row direction and the column direction. In the at least one of the strips, a pitch between central points of two adjacent unit substrate regions in an edge portion of the base substrate may be greater than a pitch between central points of two adjacent unit substrate regions in a central portion of the base substrate.

In the at least one of the strips, pitches between the central points of the unit substrate regions may sequentially increase from a central portion to an edge portion of the base substrate. In the at least one of the strips, pitches between the central points of the unit substrate regions may increase from a central line to an edge line of the base substrate.

The unit substrate regions may be aligned in at least one of the row direction and the column direction, and a plurality of strips formed of the unit substrate regions may be spaced apart from one another in at least one of the row direction and the column direction, wherein a pitch between central points of two adjacent unit substrate regions in an edge portion of the base substrate is smaller than a pitch between central points of two adjacent unit substrate regions in a central portion of the base substrate.

In at least one of the strips, pitches between the central points of the unit substrate regions may sequentially decrease from a central portion to an edge portion of the base substrate.

In at least one of the strips, pitches between the central points of the unit substrate regions may decrease from a central line to an edge line of the base substrate.

The base substrate may be a printed circuit board, a wafer or a lead frame.

A plurality of slots may be formed in the dummy substrate regions in at least one of the row direction and the column direction. Widths of the slots may be different in at least one of the row direction and the column direction.

The base substrate may be a printed circuit board (PCB), and the unit substrate regions may each include a chip mounting area, on which a chip is mounted, and the dummy substrate regions may each include a cutting region for forming individual semiconductor devices.

According to example embodiments, there is provided a substrate structure including: a base substrate; a plurality of unit substrate regions arranged on the base substrate in one or more rows and one or more columns and spaced apart from one another; and dummy substrate regions between the unit substrate regions, wherein a plurality of strips formed of the unit substrate regions are spaced apart from one another in at least one of a row direction and a column direction, and wherein in the row direction or the column direction, a first distance between two adjacent unit substrate regions among the unit substrate regions and a second distance between two adjacent second unit substrate regions among the unit substrate regions are different from each other.

The pitches between central points of the unit substrate regions in the plurality of strip groups may have a first pitch and a second pitch greater than the first pitch, and the first pitch may be repeated in at least a first strip group including at least two strips, and the second pitch may be repeated in at least a second strip group including at least two strips.

In the at least one of the strip groups, a pitch between central points of two adjacent unit substrate regions in an edge portion of the base substrate may be greater than a pitch between central points of two adjacent unit substrate regions in a central portion of the base substrate.

In the at least one of the strip groups, pitches between the central points of the unit substrate regions may increase from a central line to an edge line of the base substrate.

In the at least one of the strip groups, a pitch between central points of two adjacent unit substrate regions in an edge portion of the base substrate may be smaller than a pitch between central points of two adjacent unit substrate regions in a central portion of the base substrate.

In the at least one of the strip groups, pitches between the central points of the unit substrate regions may sequentially decrease from a central portion to an edge portion of the base substrate.

According to example embodiments, there is provided a substrate structure including: a base substrate; a plurality of unit substrate regions arranged on the base substrate in at least one of a row direction and a column direction and spaced apart from one another; and dummy substrate regions between the unit substrate regions, wherein the unit substrate regions are grouped into at least one of unit substrate region groups located in a portion of the base substrate, and a pitch between central points of two adjacent unit substrate regions included in the unit substrate region group are different from a pitch between central points of two adjacent unit substrate regions that are not included in the unit substrate region group.

The unit substrate region groups may be spaced apart from one another in at least one of the row direction and the column direction. Pitches between the central points of the unit substrate regions may be different according to the unit substrate region groups.

The unit substrate region group may be in a central portion of the base substrate. The unit substrate region group may be located at a corner of the base substrate.

The unit substrate regions may be arranged in a plurality of strips aligned in at least one of the row direction and the column direction, and the unit substrate region group may be disposed in a portion of any one of the plurality of strips. The unit substrate regions may be arranged in a plurality of strips aligned in at least one of the row direction and the column direction, and the unit substrate region group may be disposed in at least one of a plurality of strips.

The unit substrate region group may be disposed in the plurality of strips, and pitches between the central points of the unit substrate regions may be different according to the unit substrate region groups in the plurality of strips.

According to example embodiments, there is provided a substrate structure including: a base substrate; and a plurality of strips aligned on the base substrate in at least one of a row direction and a column direction and spaced apart from one another, wherein the plurality of strips each include first and second portions and a plurality of unit substrate regions spaced apart from one another on the base substrate, and wherein a first pitch between central points of two adjacent unit substrate regions of the first portion and a second pitch between central points of two adjacent unit substrate regions of the second portion are different from each other.

In at least one of the strips, a pitch between central points of two adjacent unit substrate regions in an edge portion of the base substrate may be greater than a pitch between central points of two adjacent unit substrate regions in a central portion of the base substrate. In at least one of the strips, pitches between central points of the unit substrate regions may sequentially increase from a central portion to an edge portion of the base substrate.

In at least one of the strips, a pitch between central points of two adjacent unit substrate regions in an edge portion of the base substrate may be smaller than a pitch between central points of two adjacent unit substrate regions in a central portion of the base substrate. In at least one of the strips, pitches between central points of the unit substrate regions may sequentially decrease from a central portion to an edge portion of the base substrate.

A dummy substrate region may be disposed between the strips. The unit substrate regions may each include a chip mounting area on which a chip is mounted, and the dummy substrate region may include a cutting region for forming individual semiconductor devices.

According to example embodiments, there is provided a method of a semiconductor device, the method includes: providing a base substrate having a plurality of chip mounting areas formed in an array of rows and columns, mounting a plurality of semiconductor chips on the respective plurality of chip mounting areas, so that two first semiconductor chips adjacent in a first direction are spaced apart by a first distance in the first direction, and two second semiconductor chips adjacent in the first direction are spaced apart by a second distance in the first direction greater than the first distance, cutting the base substrate between the two first semiconductor chips, and cutting the base substrate between the two second semiconductor chips.

BRIEF DESCRIPTION OF THE DRAWINGS

Exemplary embodiments of the present disclosure will be more clearly understood from the following detailed description taken in conjunction with the accompanying drawings in which.

DETAILED DESCRIPTION OF THE EMBODIMENTS

Figure 1:
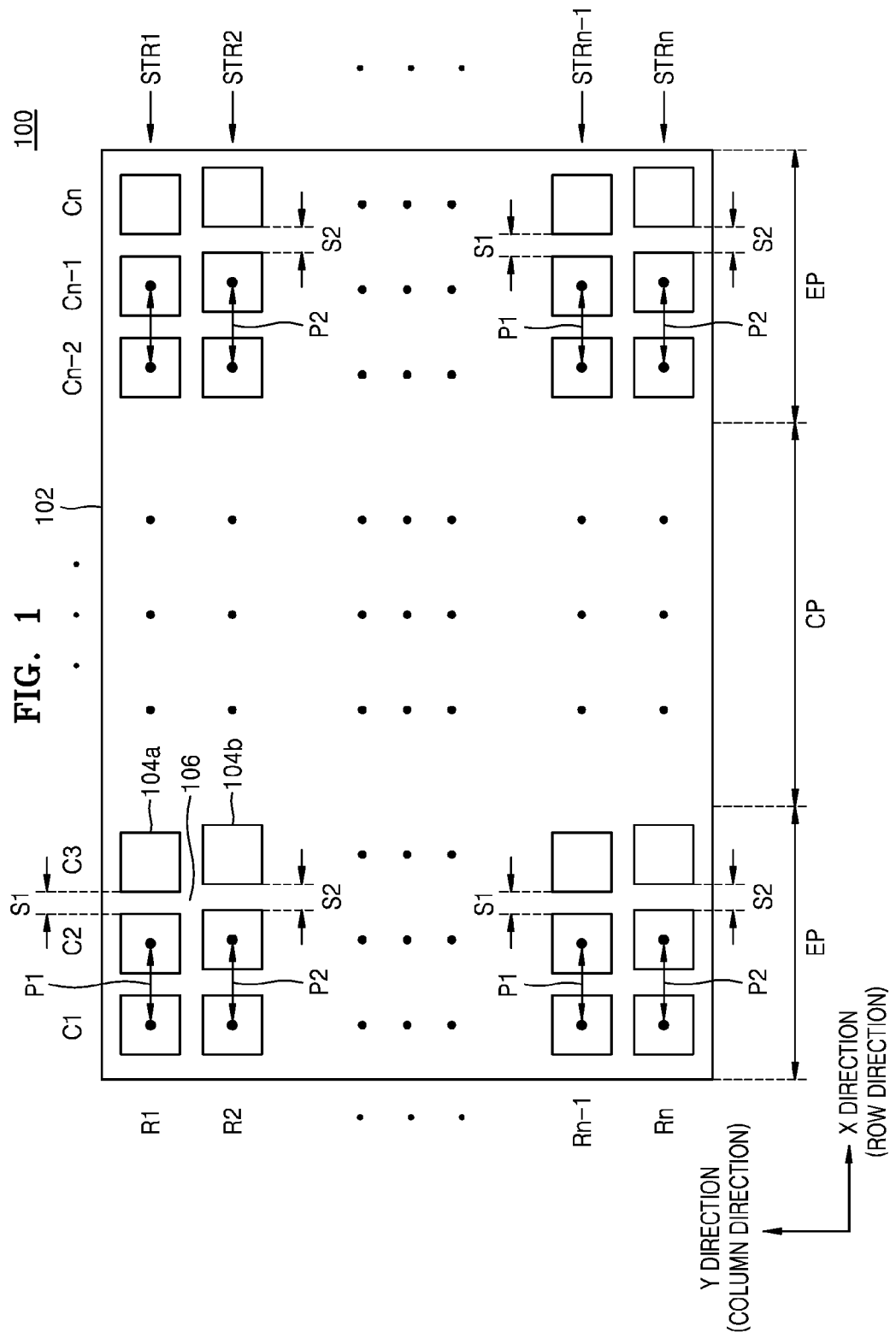
FIG. 1 is a partial plan view of a substrate structure according to an exemplary embodiment of the inventive concept.

The present disclosure will now be described more fully with reference to the accompanying drawings, in which exemplary embodiments of the disclosure are shown. The inventive concept may, however, be embodied in many different forms, and should not be construed as being limited to the embodiments set forth herein; In the drawings, the thicknesses or sizes of layers are exaggerated for clarity.

In the present specification, when a constituent element such as a film, a layer, a region, or a substrate is "on" or "connected" or "coupled" to another constituent element, it may be construed that the constituent element is on or connected or coupled to the other constituent element not only directly but also through at least one of other constituent elements interposed therebetween. On the other hand, when constituent element such as a film, a layer, a region, or a substrate is "directly on" or "directly connected" or "directly coupled" to another constituent element, or as "contacting" another element, it is construed that there is no other constituent element interposed therebetween. Like reference numerals denote like elements throughout the specification.

In the present description, terms such as 'first', 'second', etc. are used to describe various members, components, regions, layers, and/or portions. However, it is obvious that the members, components, regions, layers, and/or portions should not be defined by these terms. Unless indicated otherwise, these terms are used only for distinguishing one member, component, region, layer, or portion from another member, component, region, layer, or portion. Thus, a first member, component, region, layer, or portion which will be described may also refer to a second member, component, region, layer, or portion, without departing from the teaching of the present disclosure.

In addition, relative terms such as "on" or "above", and "under" or "below" may be used to describe relationship between elements as illustrated in the drawings. These relative terms can be understood to include different directions in addition to the described directions illustrated in the drawings. For example, when elements are turned over in the drawings, elements described to be on lower surfaces of other elements are formed on upper surfaces of the other elements. Therefore, the term "on" depends only on a predetermined direction and can include both "lower" and "upper" directions. If a device is directed in a different direction (for example, a direction rotated by 90 degrees with respect to another direction), the description of the relative terms will be construed based on the another direction.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

In the drawings, for example, according to the manufacturing techniques and/or tolerances, shapes of the illustrated elements may be modified. Thus, the inventive concept should not be construed as being limited to the embodiments set forth herein, and should include, for example, variations in the shapes caused during manufacture.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Moreover, the same or like reference numerals in each of the drawings represent the same or like components if possible. In some drawings, the connection of elements and lines is just represented to effectively explain technical content and may further include other elements or circuit blocks.

Embodiments of the present disclosure described below may be implemented as one of them, and also, the embodiments described below may be implemented by combining at least two of the embodiments. Thus, the present disclosure is not construed as being limited to any one exemplary embodiment.

As used herein, the term "and/or" includes any and all combinations of one or more of the associated listed items. Expressions such as "at least one of," when preceding a list of elements, modify the entire list of elements and do not modify the individual elements of the list.

FIG. 1 is a partial plan view of a substrate structure 100 according to an exemplary embodiment of the inventive concept.

The substrate structure 100 may include a base substrate 102, unit substrate regions 104a and 104b, and dummy substrate regions 106. The base substrate 102 may be, for example, a printed circuit board (PCB), a wafer or a lead frame. In the present exemplary embodiment, a PCB will be described as the base substrate 102. Hereinafter, each of the unit substrate regions may have the same size.

The base substrate 102 may be classified as a single-side base substrate, a two-side base substrate or a multi-layer base substrate according to the number of circuit pattern layers. In regard to a single-side base substrate, a circuit pattern layer is formed on one surface of a substrate body. In regard to a two-side base substrate, a circuit pattern layer is formed on each of two sides of a substrate body. In regard to a multi-layer base substrate, a plurality of circuit pattern layers insulated using an insulation layer are formed in a substrate body. The base substrate 102 is formed by forming a circuit pattern layer in a copper foil pattern on a substrate body that is obtained by compressing a phenol resin or an epoxy glass (or FR-4) resin to a predetermined thickness.

The plurality of unit substrate regions 104a and 104b may be arranged on the base substrate 102. The unit substrate regions 104a and 104b may include chip-mounting regions in which semiconductor chips are mounted. In some embodiments, a size of each of the unit substrate regions 104a and 104b may be equal to each other. The dummy substrate regions 106 may be disposed between the unit substrate regions 104a and 104b. The dummy substrate regions 106 are regions where no semiconductor chips are mounted, and may include a cutting region to form individual semiconductor chips. The circuit pattern layer may be formed on a portion of the dummy substrate regions 106.

The unit substrate regions 104a and 104b may be arranged on the base substrate 102 in a row direction (X direction) and a column direction (Y direction) and may be spaced apart from each other. R1 to Rn (n is an integer) unit substrate regions 104a and 104b may be disposed in the column direction, and C1 to Cn (n is an integer) unit substrate regions 104a and 104b may be disposed in the row direction. Although FIG. 1 shows that a number of rows (i.e., R1 to Rn) and a number of columns (i.e., C1 to Cn) are equal, in other embodiments, the numbers of rows and columns may be different from each other. The number of unit substrate regions 104a and 104b may be set according to necessity.

The unit substrate regions 104a and 104b may be arranged in a plurality of strips STR1 to STRn (n is an integer) aligned in at least one of the row direction and the column direction. The unit substrate regions 104a and 104b aligned along one of the row direction and the column direction may be referred to as strips. The strips STR1 to STRn (n is an integer) may be spaced apart from one another in at least one of the row direction and the column direction, for example, in the column direction.

Each of the strips STR1 to STRn (n is an integer) may be aligned in one of the row direction and the column direction, for example, in the row direction as illustrated in FIG. 1. In other examples, the plurality of the strips STR1 to STRn (n is an integer) may be arranged in one of the row direction and the column direction, for example, in the column direction. In the present specification, alignment may indicate that the unit substrate regions 104a and 104b or the strips STR1 to STRn are (n is an integer) are aligned in at least one of the row direction and the column direction.

In some embodiments, the base substrate 102 may be cut into strips, for example, into one or more strips, and then a semiconductor chip mounting process, a molding process, or a solder attachment process or the like may be performed on the base substrate 102 which is in units of strips that are easy to handle.

As used herein, a semiconductor device may refer to various items such as a semiconductor chip, a memory device, one or more logic devices, a package, or combinations thereof. A semiconductor chip, a memory chip, or a logic chip may be formed from a wafer. A semiconductor device may comprise a package which may include one or more chips stacked on a package substrate, or a package-on-package device including a plurality of packages.

An electronic device, as used herein, may refer to one of these devices and may also include products that include these devices, such as a memory card, a memory module, a hard drive including additional components, a mobile phone, laptop, tablet, desktop, camera, server, or other consumer electronic device.

The individual strips STR1 to STRn (n is an integer) are aligned in the row direction in FIG. 1 in order to easily cut the base substrate 102 in the row direction.

Pitches P1 and P2 between central points of two adjacent unit substrate regions 104a and 104b of the respective strips STR1 to STRn (n is an integer) may be different. A pitch between central points of the two adjacent unit substrate regions 104a that are arranged in odd numbered strips STR1, . . . , STRn−1 may be pitch P1, and a distance between the two adjacent unit substrate regions 104a may be a distance S1. A pitch between central points of the two adjacent unit substrate regions 104b that are arranged in even numbered strips STR2, . . . , STRn may be the pitch P2, which is greater than the pitch P1, and a distance S2 between the two adjacent unit substrate regions 104b may be greater than the distance S1. The pitch P1 and the pitch P2 that is greater than the pitch P1 may be repeated between central points of two adjacent unit substrate regions of a plurality of strips in at least one of the column direction and the row direction, for example, in the column direction.

The strips STR1 to STRn (n is an integer) may be divided into a central portion CP and edge portions EP in at least one of the column direction and the row direction, for example, in the row direction. Also, the base substrate 102 may be divided into the central portion CP and the edge portions EP in at least one of the column direction and the row direction, for example, in the row direction. In example embodiments, the central portion CP of the base substrate 102 may refer to a portion which includes one or more unit substrate regions 104a and 104b disposed symmetrically with respect to and near a central line of the base substrate 102 in a row direction. Each of the edge portions EP of the base substrate 102 may refer to a portion which includes one or more unit substrate regions 104a and 104b disposed between one end line of the base substrate 102 and the central portion CP of the base substrate 102 in the row direction. The central line of the base substrate 102 may be located on portions of unit substrate regions 104a and 104b or on a portion of the dummy substrate regions 106. In FIG. 1, pitches between central points of the two adjacent unit substrate regions 104a and 104b in the central portion CP and the edge portions EP of the strips STR1 to STRn (n is an integer) and the base substrate 102 may be identical to the pitch P1 (or the pitch P2).

As described above, different pitches as the pitches P1 and P2 may be set between the central points of the two adjacent unit substrate regions 104a and 104b according to the strips STR1 to STRn (n is an integer). Thus, in the substrate structure 100, when performing a semiconductor chip forming process or other various subsequent processes such as a wire bonding process, a molding process or a solder attachment process, a difference in coefficients of thermal expansion of the unit substrate regions 104a and 104b located on the base substrate 102 or the strips STR1 to STRn (n is an integer) may be adjusted.

For example, when forming a molding layer on the substrate structure 100, a thermal expansion ratio (or shrinkage ratio) of the molding layer may be varied according to the pitches P1 and P2 between the unit substrate regions 104a and 104b. A shrinkage ratio of the molding layer on the substrate structure 100 in the pitch P2 may be greater than that of molding layer in the pitch P1. A shrinkage ratio of the molding layer may be varied according to characteristics of a material of the molding layer. Accordingly, warpage of the base substrate 102 or the strips STR1 to STRn (n is an integer) may be reduced by adjusting a thermal expansion ratio (or shrinkage ratio) of the molding layer formed on the substrate structure 100, in which the pitches P1 and P2 between the unit substrate regions 104a and 104b are different.

Figure 2:
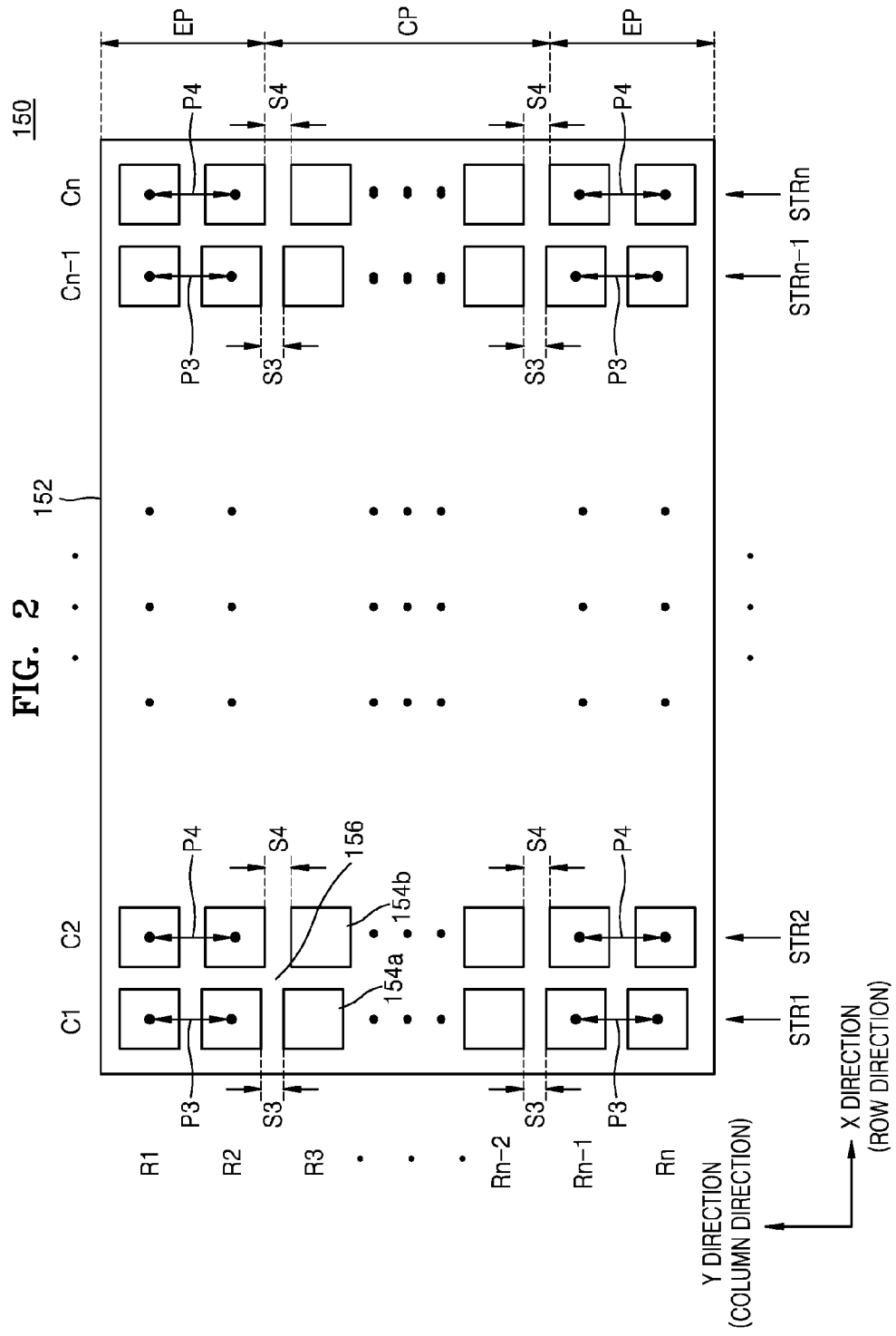
FIG. 2 is a partial plan view of a substrate structure according to an exemplary embodiment of the inventive concept.

FIG. 2 is a partial plane view illustrating a substrate structure 150 according to an exemplary embodiment of the inventive concept.

The substrate structure 150 may be the same as the substrate structure 100 of FIG. 1, except that a plurality of strips STR1 to STRn (n is an integer) are arranged in a row direction, and each of the strips STR1 to STRn (n is an integer) is aligned in a column direction. Thus, description provided above with reference to FIG. 1 will be omitted or simplified below.

The substrate structure 150 may include a base substrate 152, unit substrate regions 154a and 154b, and dummy substrate regions 156. The base substrate 152 may correspond to the base substrate 102 of FIG. 1. The unit substrate regions 154a and 154b may correspond to the unit substrate regions 104a and 104b of FIG. 1. For example, a size of each of the unit substrate regions 154a and 154b may be equal to each other. The dummy substrate regions 156 may correspond to the dummy substrate regions 106 of FIG. 1.

The unit substrate regions 154a and 154b may be arranged on the base substrate 152 in the row direction (X direction) and the column direction (Y direction) and may be spaced apart from each other. R1 to Rn (n is an integer) unit substrate regions 154a and 154b may be disposed in the column direction, and C1 to Cn (n is an integer) unit substrate regions 154a and 154b may be disposed in the row direction. Although FIG. 2 shows that a number of rows (i.e., R1 to Rn) and a number of columns (i.e., C1 to Cn) are equal, in other embodiments, the numbers of rows and columns may be different from each other. The number of unit substrate regions 154a and 154b may be set according to necessity.

The unit substrate regions 154a and 154b may be arranged in a plurality of strips STR1 to STRn (n is an integer) aligned in at least one of the row direction and the column direction. The unit substrate regions 154a and 154b extending in one of the row direction and the column direction may be referred to as strips. The strips STR1 to STRn (n is an integer) may be spaced apart from one another in at least one of the row direction and the column direction, for example, in the row direction.

In FIG. 2, each of the strips STR1 to STRn (one of the strips STR1 to STRn, n is an integer) is aligned in one of the row direction and the column direction, for example, in the column direction.

The base substrate 152 may be cut in units of strips, for example, into one or more strips, and then a semiconductor chip mounting process, a molding process, or a solder attachment process or the like may be performed on the base substrate 152 which is in units of strips that are easy to handle. The individual strips STR1 to STRn (n is an integer) are aligned in the column direction in FIG. 2 in order to easily cut the base substrate 152 in the column direction.

Pitches P3 and P4 between central points of the two adjacent unit substrate regions 154a and 154b of the respective strips STR1 to STRn (n is an integer) may be different. A pitch between central points of the two adjacent unit substrate regions 154a that are arranged in odd-numbered strips STR1 to STRn−1 may be a pitch P3, and a distance between the two adjacent unit substrate regions 154a may be a distance S3. A pitch between central points of the two adjacent unit substrate regions 154b that are arranged in even-numbered strips STR2 to STRn may be the pitch P4 that is greater than the pitch P3, and a distance S4 between the two adjacent unit substrate regions 154b may be greater than the distance S3. Pitches of a first value (the pitch P3) and a second value (the pitch P4) greater than the first value (the pitch P3) may be repeated between central points of two adjacent unit substrate regions of a plurality of strips in at least one of the column direction and the row direction, for example, in the row direction.

The strips STR1 to STRn (n is an integer) may be divided into a central portion CP and edge portions EP in at least one of the column direction and the row direction, for example, in the column direction. Also, the base substrate 152 may be divided into the central portion CP and the edge portion EP in at least one of the column direction and the row direction, for example, in the column direction. In example embodiments, the central portion CP of the base substrate 152 may refer to a portion which includes one or more unit substrate regions 154a and 154b disposed symmetrically with respect to and near a central line of the base substrate 152 in a column direction. Each of the edge portions EP of the base substrate 152 may refer to a portion which includes one or more unit substrate regions 154a and 154b disposed between one end line of the base substrate 152 and the central portion CP of the base substrate 152 in the column direction. The central line of the base substrate 152 may be located on portions of unit substrate regions 154a and 154b or on a portion of the dummy substrate regions 156. In FIG. 2, pitches between the central points of the two adjacent unit substrate regions in the central portion CP and the edge portion EP of the strips STR1 to STRn (n is an integer) and the base substrate 152 may be identical as the pitch P3 (or the pitch P4).

As described above, different pitches as the pitches P3 and P4 may be set between the central points of the two adjacent unit substrate regions 154a and 154b according to the respective strips STR1 to STRn (n is an integer). Accordingly, according to the substrate structure 150, warpage of the base substrate 152 or the strips STR1 to STRn (n is an integer) may be reduced or prevented by adjusting a difference in coefficients of thermal expansion of the unit substrate regions 154a and 154b located on the base substrate 152 or the strips STR1 to STRn (n is an integer).

Figure 3:
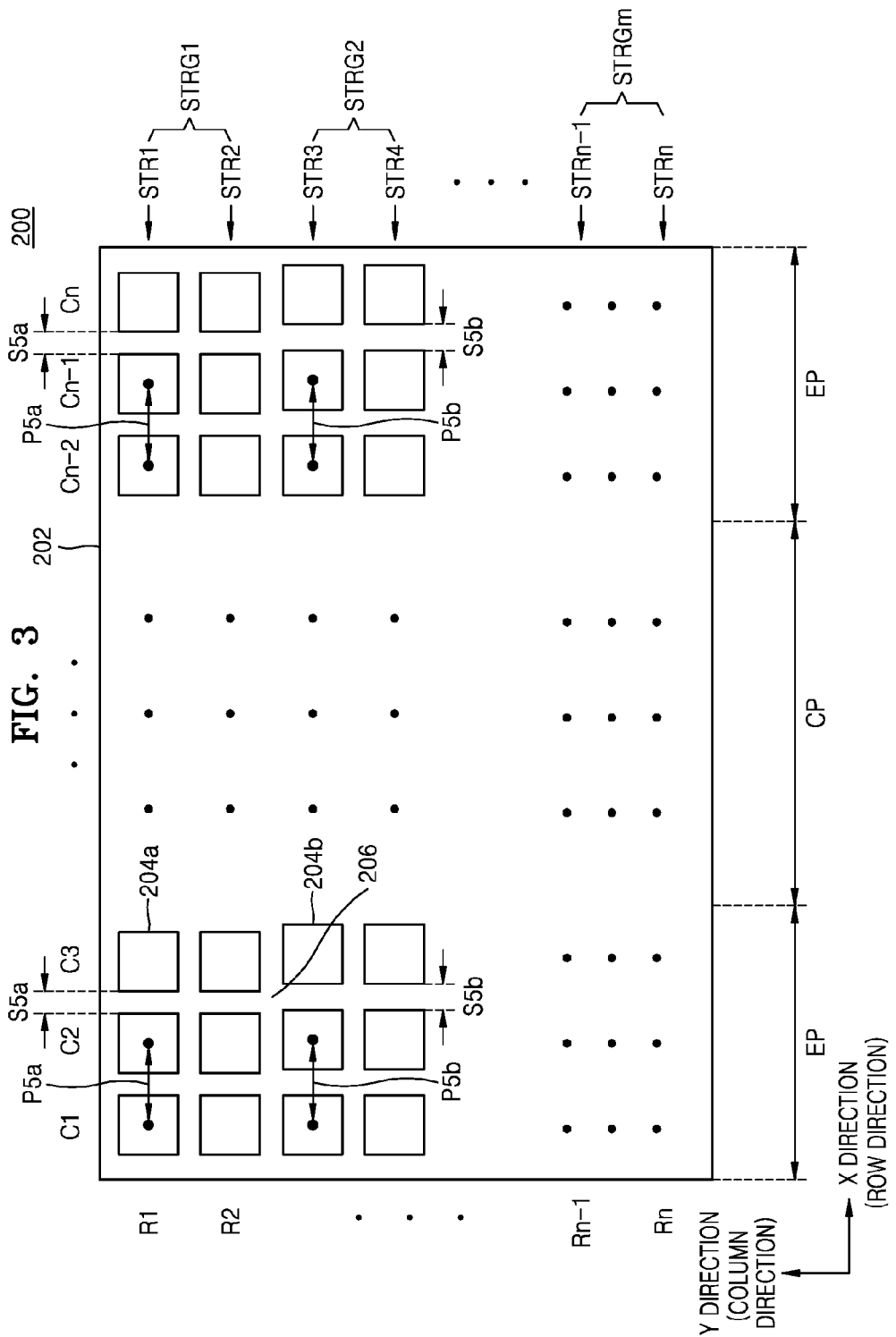
FIG. 3 is a partial plan view of a substrate structure according to an exemplary embodiment of the inventive concept.

FIG. 3 is a partial plane view illustrating a substrate structure 200 according to an exemplary embodiment of the inventive concept.

The substrate structure 200 may be the same as the substrate structure 100 of FIG. 1 except for different pitches S5a and S5b of unit substrate regions of a plurality of strips STRG1 to STRGm (m is an integer). Thus, description provided above with reference to FIG. 1 will be omitted or simplified below.

The substrate structure 200 may include a base substrate 202, unit substrate regions 204a and 204b, and dummy substrate regions 206. The base substrate 202 may correspond to the base substrate 102 of FIG. 1. The unit substrate regions 204a and 204b may correspond to the unit substrate regions 104a and 104b of FIG. 1. For example, a size of each of the unit substrate regions 204a and 204b may be equal to each other. The dummy substrate regions 206 may correspond to the dummy substrate regions 106 of FIG. 1.

The unit substrate regions 204a and 204b may be disposed on the base substrate 202. The unit substrate regions 204a and 204b may be arranged on the base substrate 202 in a row direction (X direction) and a column direction (Y direction) and may be spaced apart from each other. R1 to Rn (n is an integer) Unit substrate regions 204a and 204b may be disposed in the column direction, and C1 to Cn (n is an integer) unit substrate regions 204a and 204b may be disposed in the row direction. Although FIG. 3 shows that a number of rows (i.e., R1 to Rn) and a number of columns (i.e., C1 to Cn) are equal, in other embodiments, the numbers of rows and columns may be different from each other. The number of unit substrate regions 204a and 204b may be set according to necessity.

The unit substrate regions 204a and 204b may be arranged in a plurality of strips STR1 to STRn (n is an integer) aligned in at least one of the row direction and the column direction. In addition, the unit plurality of strips STR1 to STRn (n is an integer) may be grouped into strip groups STRG1 to STRGm (m is an integer). The strips STR1 to STRn (n is an integer) and the strip groups STRG1 to STRGm (m is an integer) may be each spaced apart from one another in at least one of the row direction and the column direction, for example, in the column direction.

Each of the strips STR1 to STRn (n is an integer) and each of the strip groups STRG1 to STRGm (m is an integer) may be aligned in one of the row direction and the column direction, for example, in the row direction as illustrated in FIG. 3. However, the plurality of strips STR1 to STRn and the strip groups STRG1 to STRGm may be arranged in the column direction.

The pitches P5a and P5b between central points of the two adjacent unit substrate regions 204a and 204b of the respective strip groups STRG1 to STRGm may be different. A pitch between central points of the two adjacent unit substrate regions 204a that are arranged in odd-numbered strip groups STRG1 to STRGm−1 may be the pitch P5a, and a distance between the two adjacent unit substrate regions 204a may be a distance S5a. A pitch between central points of the two adjacent unit substrate regions 204b that are arranged in even-numbered strip groups STRG2 to STRGm may be the pitch P5b that is greater than the pitch P5a, and a distance S5b between the two adjacent unit substrate regions 204b may be greater than the distance S5a. Pitches of a first value (e.g., the pitch P5a) and a second value (e.g., the pitch P5b) greater than the first value may be repeated between central points of two adjacent unit substrate regions of the plurality of strip groups STRG1 to STRGm (m is an integer) in at least one of the column direction and the row direction, for example, in the column direction.

The strip groups STRG1 to STRGm (m is an integer) may be divided into a central portion CP and edge portions EP in at least one of the column direction and the row direction, for example, in the row direction. Also, the base substrate 202 may be divided into the central portion CP and the edge portion EP in at least one of the column direction and the row direction, for example, in the row direction. In example embodiments, the central portion CP of the base substrate 202 may refer to a portion which includes one or more unit substrate regions 204a and 204b disposed symmetrically with respect to and near a central line of the base substrate 202 in a row direction. Each of the edge portions EP of the base substrate 202 may refer to a portion which includes one or more unit substrate regions 204a and 204b disposed between one end line of the base substrate 202 and the central portion CP of the base substrate 202 in the row direction. The central line of the base substrate 202 may be located on portions of unit substrate regions 204a and 204b or on a portion of the dummy substrate regions 206. In FIG. 3, pitches between central points of the two adjacent unit substrate regions in the central portion CP and the edge portion EP of the strip groups STRG1 to STRGm (m is an integer) and the base substrate 202 may be identical as the pitch P5a (or the pitch P5b).

As described above, different pitches as the pitches P5a and P5b may be set between the central points of the two adjacent unit substrate regions 204a and 204b according to the respective strip groups STRG1 to STRGm (m is an integer). Accordingly, warpage of the base substrate 202, the strips STR1 to STRn (n is an integer), and the strip groups STRG1 to STRGm (m is an integer) may be reduced or prevented by adjusting a difference in coefficients of thermal expansion of the unit substrate regions 204a and 204b located on the base substrate 202, the strips STR1 to STRn (n is an integer), and the strip groups STRG1 to STRGm (m is an integer).

Figure 4:
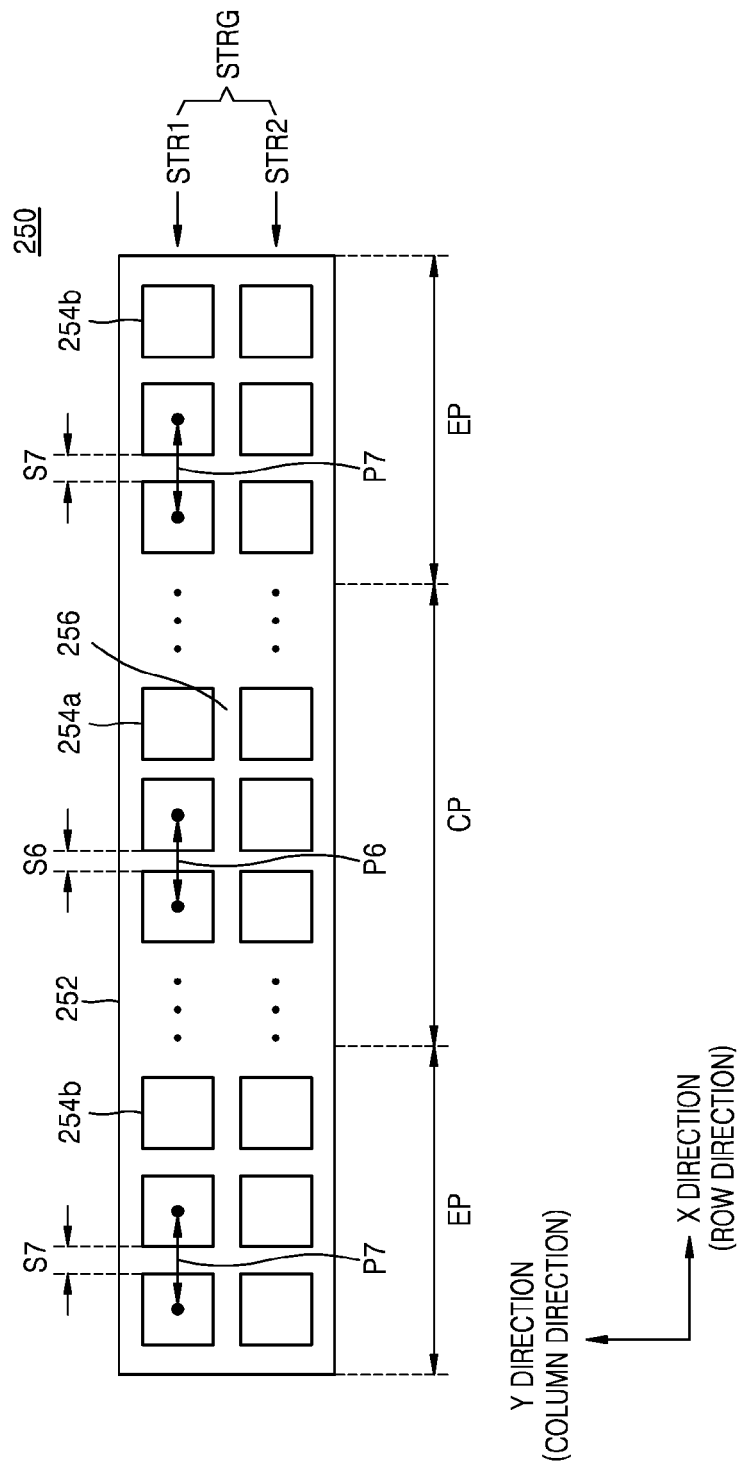
FIG. 4 is a partial plan view of a substrate structure according to an exemplary embodiment of the inventive concept.

FIG. 4 is a partial plane view illustrating a substrate structure 250 according to an exemplary embodiment of the inventive concept.

The substrate structure 250 may be the same as the substrate structures 100 and 200 of FIGS. 1 and 3 except for different pitches P6 and P7 of unit substrate regions in strip STR1 or STR2 or strip group STRG. Thus, description provided above with reference to FIGS. 1 and 3 will be omitted or simplified below.

The substrate structure 250 may include a base substrate 252, unit substrate regions 254a and 254b, and dummy substrate regions 256. The base substrate 252 may correspond to the base substrates 102 and 202 of FIGS. 1 and 3. The unit substrate regions 254a and 254b may correspond to the unit substrate regions 104a, 104b, 204b, and 204b of FIGS. 1 and 3. The dummy substrate regions 256 may correspond to the dummy substrate regions 106 and 206 of FIGS. 1 and 3.

The plurality of unit substrate regions 254a and 254b may be disposed on the base substrate 252. The unit substrate regions 254a and 254b may be arranged on the base substrate 252 in a row direction (X direction) and a column direction (Y direction) and may be spaced apart from each other. The unit substrate regions 254a and 254b may be arranged in a plurality of strips STR1 and STR2 aligned in at least one of the row direction and the column direction, for example, in the row direction. In addition, the plurality of strips STR1 and STR2 may be grouped into a strip group STRG.

In FIG. 4, each of the strips (one of the strips STR1 and STR2) and the strip group STRG are aligned in one of the row direction and the column direction, for example, in the row direction, and the plurality of strips STR1 and STR2 are disposed in one of the row direction and the column direction, for example, in the column direction. In FIG. 4, one strip group STRG is illustrated for convenience.

The strips STR1 and STR2 and the strip group STRG may be divided into a central portion CP and edge portions EP in at least one of the column direction and the row direction, for example, in the row direction. Also, the base substrate 252 may be divided into the central portion CP and the edge portions EP in at least one of the column direction and the row direction, for example, in the row direction. In example embodiments, the central portion CP of the base substrate 252 may refer to a portion which includes one or more unit substrate regions 254a disposed symmetrically with respect to and near a central line of the base substrate 252 in a row direction. Each of the edge portions EP of the base substrate 252 may refer to a portion which includes one or more unit substrate regions 254b disposed between one end line of the base substrate 252 and the central portion CP of the base substrate 252 in the row direction. The central line of the base substrate 252 may be located on portions of unit substrate regions 254a or on a portion of the dummy substrate regions 256.

The pitch P6 between central points of the two adjacent unit substrate regions 254a and the pitch P7 between central points of the two adjacent unit substrate regions 254b may be different in one of the row direction and the column direction, for example, in the row direction, according portions of a strip (e.g., one of the strips STR1 and STR2) or a strip group STRG. For example, in a strip (e.g., one of the strips STR1 and STR2) or a strip group STRG, the pitch P7 between central points of the two adjacent unit substrate regions 254b located in the edge portion EP of the base substrate 252 may be greater than the pitch P6 between central points of the unit substrate regions 254a located in the central portion CP of the base substrate 252.

For example, in a strip (e.g., one of the strips STR1 and STR2) or a strip group STRG, a pitch between central points of the two adjacent unit substrate regions 254a, which are located in the central portion CP of the base substrate 252, may be the pitch P6, and a distance between the two adjacent unit substrate regions 254a may be a distance S6. Further, in a strip (e.g., one of the strips STR1 and STR2) or a strip group STRG, a pitch between central points of the two adjacent unit substrate regions 254b, which are located in the edge portion EP of the base substrate 252, may be the pitch P7 that is greater than the pitch P6, and a distance between the two adjacent unit substrate regions 254b may be a distance S7 that is greater than the distance S6.

As described above, in the substrate structure 250, different pitches as the pitches P6 and P7 may be set between the central points of the two adjacent unit substrate regions 254a and 254b according to portions of one strip (e.g., one of the strips STR1 and STR2) or one strip group STRG in at least one of the column direction and the row direction, for example, in the row direction.

Accordingly, according to the substrate structure 250, warpage of the base substrate 252, the strips STR1 and STR2, and the strip group STRG may be reduced or prevented by adjusting a difference in coefficients of thermal expansion of the unit substrate regions 254a and 254b located on the base substrate 252, the strips STR1 and STR2, and the strip group STRG when performing subsequent processes.

Figure 5:
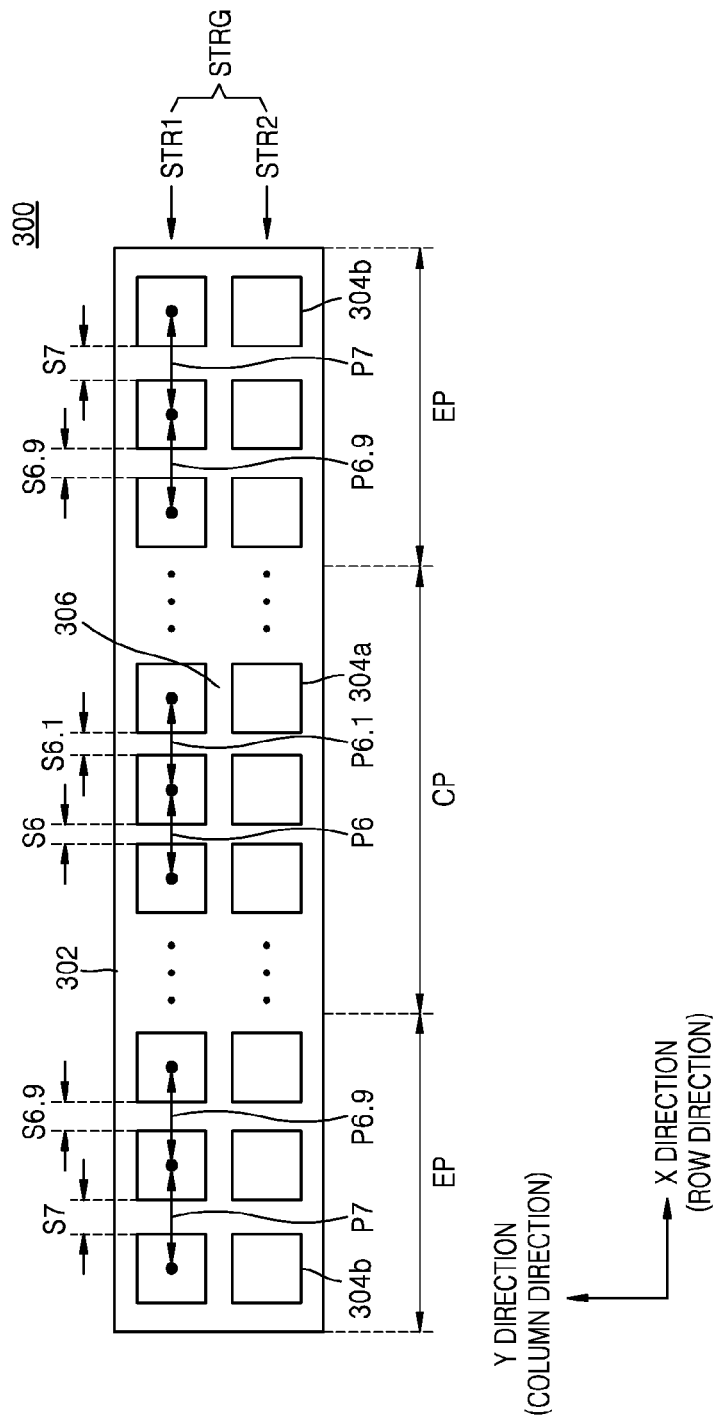
FIG. 5 is a partial plan view of a substrate structure according to an exemplary embodiment of the inventive concept.

FIG. 5 is a partial plane view illustrating a substrate structure 300 according to an exemplary embodiment of the inventive concept.

The substrate structure 300 may be the same as the substrate structures 100, 200, and 250 of FIGS. 1, 3, and 4 except that pitches P6 and P7 of unit substrate regions are varied sequentially according to portions of strip STR1 or STR2 or strip group STRG. Thus, description provided above with reference to FIGS. 1, 3, and 4 will be omitted or simplified below.

The substrate structure 300 may include a base substrate 302, unit substrate regions 304a and 304b, and dummy substrate regions 306. The base substrate 302 may correspond to the base substrate 102, 202, or 252 of FIG. 1, 3 or 4. The unit substrate regions 304a and 304b may correspond to the unit substrate regions 104a, 104b, 204b, 204b, 254a, and 254b of FIG. 1, 3 or 4. The dummy substrate regions 306 may correspond to the dummy substrate regions 106, 206, and 256 of FIG. 1, 3 or 4.

The plurality of unit substrate regions 304a and 304b may be disposed on the base substrate 302. The unit substrate regions 304a and 304b may be arranged on the base substrate 302 in a row direction (X direction) and a column direction (Y direction) and may be spaced apart from each other. The unit substrate regions 304a and 304b may be arranged in a plurality of strips STR1 and STR2 aligned in at least one of the row direction and the column direction, for example, in the row direction. In addition, the plurality of strips STR1 and STR2 may be grouped into a strip group STRG.

In FIG. 5, each of the strips (one of the strips STR1 and STR2) and the strip group STRG are aligned in one of the row direction and the column direction, for example, in the row direction, and the plurality of strips STR1 and STR2 are disposed in one of the row direction and the column direction, for example, in the column direction. In FIG. 5, one strip group STRG is illustrated for convenience.

The strips STR1 and STR2 and the strip group STRG may be divided into a central portion CP and edge portions EP in at least one of the column direction and the row direction, for example, in the row direction. Also, the base substrate 302 may be divided into the central portion CP and the edge portions EP in at least one of the column direction and the row direction, for example, in the row direction. In example embodiments, the central portion CP of the base substrate 302 may refer to a portion which includes one or more unit substrate regions 304a disposed symmetrically with respect to and near a central line of the base substrate 302 in a row direction. Each of the edge portions EP of the base substrate 302 may refer to a portion which includes one or more unit substrate regions 304b disposed between one end line of the base substrate 302 and the central portion CP of the base substrate 302 in the row direction. The central line of the base substrate 302 may be located on portions of unit substrate regions 304a or on a portion of the dummy substrate regions 306.

Pitches P6, P6.1, P6.9, and P7 between central points of the two adjacent unit substrate regions 304a and 304b may be different in one of the row direction and the column direction, for example, in the row direction, according portions of a strip (e.g., one of the strips STR1 and STR2) or a strip group STRG. For example, in a strip (e.g., one of the strips STR1 and STR2) or a strip group STRG, a pitch size may increase from the central portion CP to each of the edge portions EP of the base substrate 302. For example, pitch P6<P6.1<P6.9<P7.

For example, in a strip (e.g., one of the strips STR1 and STR2) or a strip group STRG, pitches between central points of the two adjacent unit substrate regions 304a, which are located in the central portion CP of the base substrate 302, may be the pitch P6 and the pitch P6.1 on the right side of the pitch P6, and distances between the two adjacent unit substrate regions 304a may be a distance S6 and a distance S6.1 on the left side and right side of the distance S6. Further, in a strip (e.g., one of the strips STR1 and STR2) or a strip group STRG, pitches between central points of the two adjacent unit substrate regions 304b, which are located in each of the edge portion EP of the base substrate 302, may be the pitches P6.9 and P7 on the left side and right side of the pitch P6.9, which are greater than the pitches P6 and P6.1, and distances between the two adjacent unit substrate regions 304b may be a distance S6.9 and a distance S7 on the left side and right side of the distance S6.9.

As described above, in the substrate structure 300, sequentially increasing pitches from the pitch P6 to the pitch P7 may be set between the central points of the two adjacent unit substrate regions 304a and 304b according to portions of one strip (one of the strips STR1 and STR2) or one strip group STRG in at least one of the column direction and the row direction, for example, in the row direction.

Accordingly, according to the substrate structure 300, warpage of the base substrate 302, the strips STR1 and STR2, and the strip group STRG may be reduced or prevented by adjusting a difference in coefficients of thermal expansion of the unit substrate regions 304a and 304b located on the base substrate 302, the strips STR1 and STR2, and the strip group STRG when performing subsequent processes.

Figure 6:
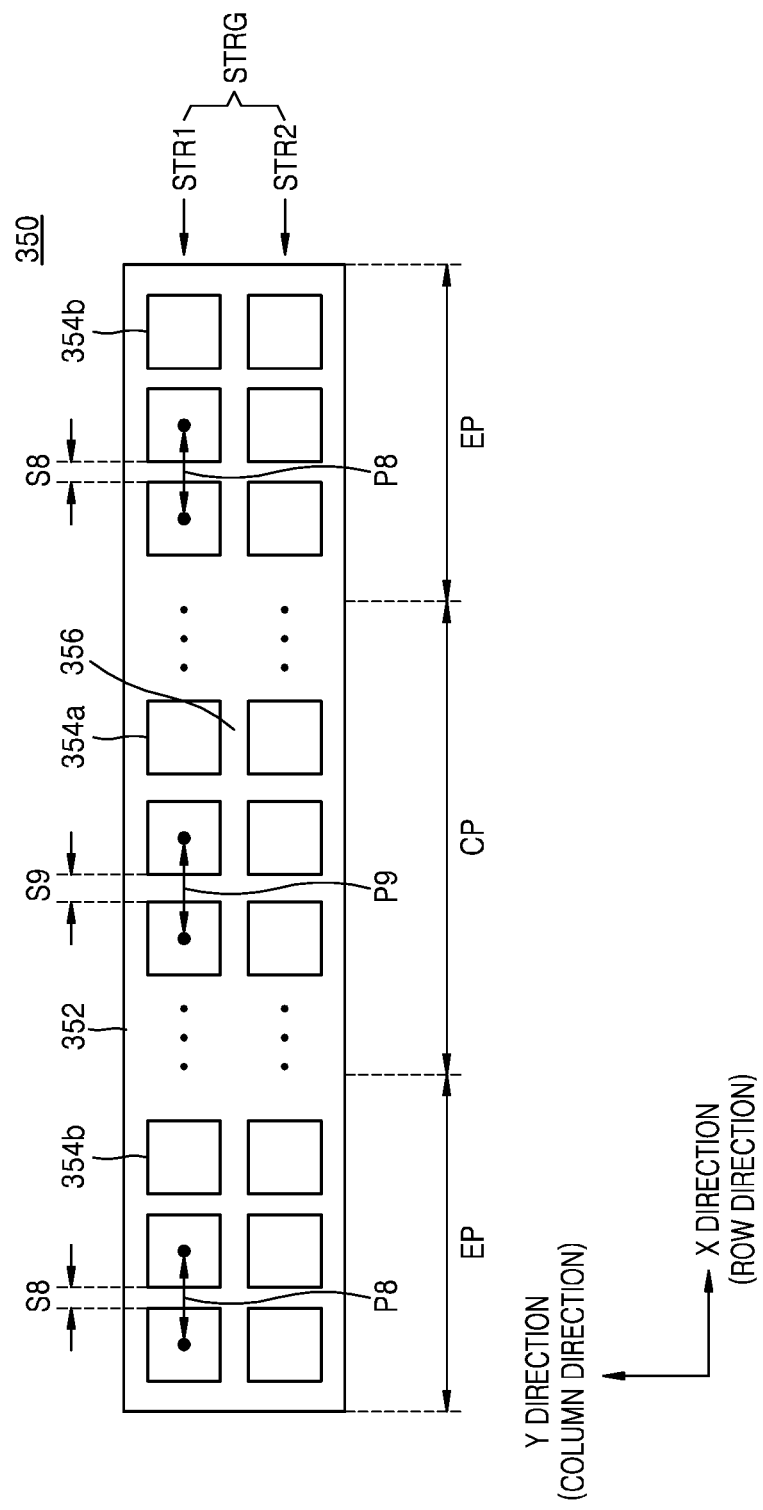
FIG. 6 is a partial plan view of a substrate structure according to an exemplary embodiment of the inventive concept.

FIG. 6 is a partial plane view illustrating a substrate structure 350 according to an exemplary embodiment of the inventive concept.

The substrate structure 350 may be the same as the substrate structures 100 and 350 of FIGS. 1 and 3 except that pitches P8 and P9 of two adjacent unit substrate regions 354a and 354b are different according to portions of strip STR1 or STR2 or strip group STRG. Thus, description provided above with reference to FIGS. 1 and 3 will be omitted or simplified below.

The substrate structure 350 may include a base substrate 352, unit substrate regions 354a and 354b, and dummy substrate regions 356. The base substrate 352 may correspond to the base substrates 102 and 202 of FIGS. 1 and 3. The unit substrate regions 354a and 354b may correspond to the unit substrate regions 104a, 104b, 204b, and 204b of FIGS. 1 and 3. The dummy substrate regions 356 may correspond to the dummy substrate regions 106 and 206 of FIGS. 1 and 3.

The plurality of unit substrate regions 354a and 354b may be disposed on the base substrate 352. The unit substrate regions 354a and 354b may be arranged on the base substrate 352 in a row direction (X direction) and a column direction (Y direction) and may be spaced apart from each other. The unit substrate regions 354a and 354b may be arranged in a plurality of strips STR1 and STR2 in at least one of the row direction and the column direction, for example, in the row direction. In addition, the plurality of strips STR1 and STR2 may be grouped into a strip group STRG.

In FIG. 6, each of the strips (one of the strips STR1 and STR2) and the strip group STRG are aligned in one of the row direction and the column direction, for example, in the row direction, and the plurality of strips STR1 and STR2 are disposed in one of the row direction and the column direction, for example, in the column direction. In FIG. 6, one strip group STRG is illustrated for convenience.

The strips STR1 and STR2 and the strip group STRG may be divided into a central portion CP and edge portions EP in at least one of the column direction and the row direction, for example, in the row direction. Also, the base substrate 352 may be divided into the central portion CP and the edge portions EP in at least one of the column direction and the row direction, for example, in the row direction. In example embodiments, the central portion CP of the base substrate 352 may refer to a portion which includes one or more unit substrate regions 354a disposed symmetrically with respect to and near a central line of the base substrate 352 in a row direction. Each of the edge portions EP of the base substrate 352 may refer to a portion which includes one or more unit substrate regions 354b disposed between one end line of the base substrate 352 and the central portion CP of the base substrate 352 in the row direction. The central line of the base substrate 352 may be located on portions of unit substrate regions 354a or on a portion of the dummy substrate regions 356.

The pitches P8 and P9 between central points of the two adjacent unit substrate regions 354a and 354b may be different according to portions of one strip (one of the strips STR1 and STR2) or one strip group STRG in one of the row direction and the column direction, for example, in the row direction. For example, the pitches P8 and P9 between the central points of the adjacent unit substrate regions 354a and 354b in one strip (one of the strips STR1 and STR2) and one strip group STRG may be smaller in each of the edge portions EP than in the central portion CP of the base substrate 352.

For example, a pitch between the central points of the two adjacent unit substrates 354a in the central portion CP of one strip (one of the strips STR1 and STR2) and one strip group STRG may be a pitch P9, and a distance between the two adjacent substrate regions 354a may be a distance S9. A pitch between central points of the two adjacent unit substrate regions 354b of each of the edge portions that are arranged in one strip (one of the strips STR1 and STR2) and one strip group STRG may be the pitch P8 that is smaller than the pitch P9, and a distance S8 between the two adjacent unit substrate regions 354b may be smaller than the distance S9.

As described above, in the substrate structure 350, different pitches as the pitches P8 and P9 may be set between the central points of the two adjacent unit substrate regions 354a and 354b according to portions of one strip (one of the strips STR1 and STR2) and one strip group STRG in at least one of the column direction and the row direction, for example, in the row direction.

Accordingly, according to the substrate structure 350, warpage of the base substrate 352, the strips STR1 and STR2, and the strip group STRG may be reduced or prevented by adjusting a difference in coefficients of thermal expansion of the unit substrate regions 354a and 354b located on the base substrate 352, the strips STR1 and STR2, and the strip group STRG when performing subsequent processes.

Figure 7:
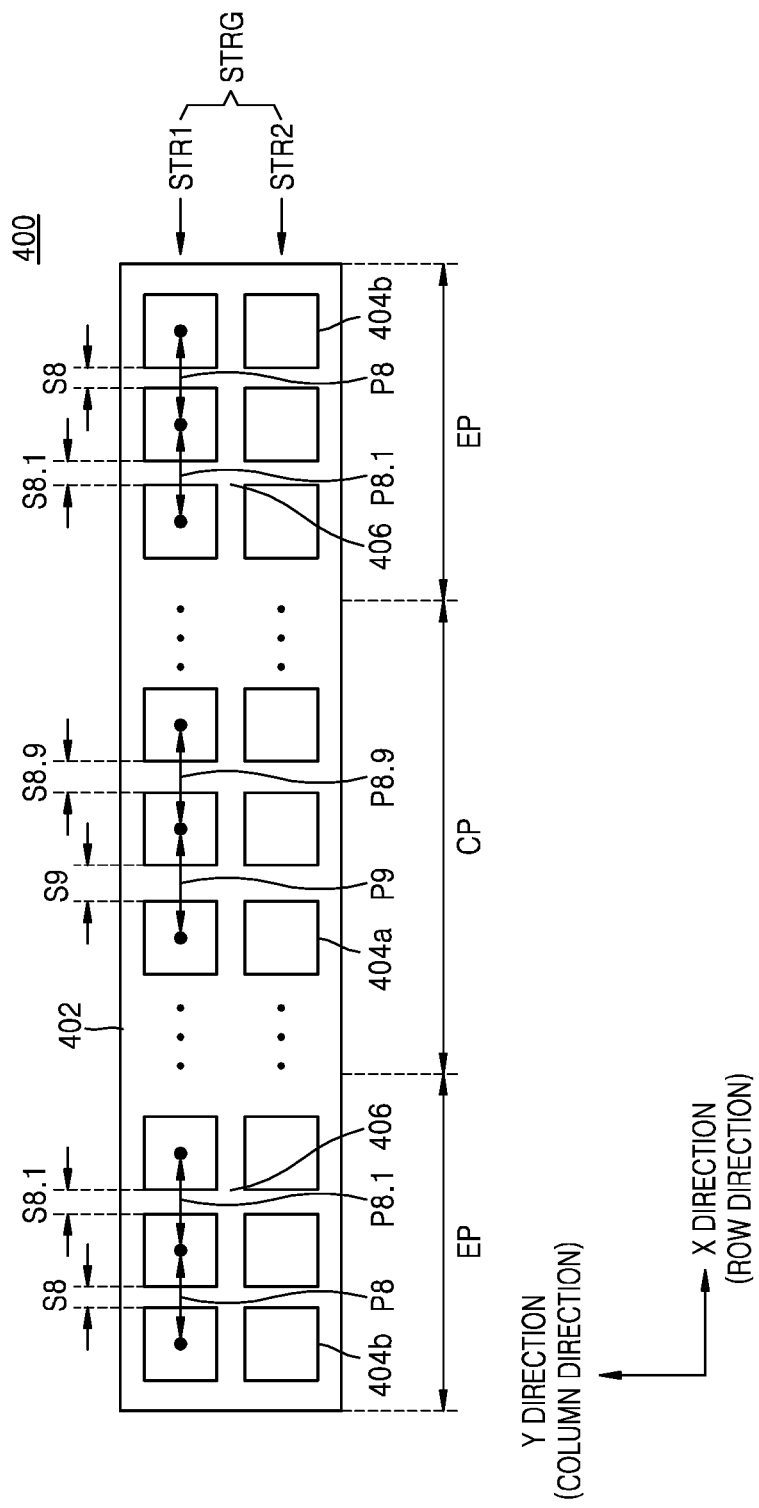
FIG. 7 is a partial plan view of a substrate structure according to an exemplary embodiment of the inventive concept.

FIG. 7 is a partial plane view illustrating a substrate structure 400 according to an exemplary embodiment of the inventive concept.

The substrate structure 400 may be the same as the substrate structures 100, 200, and 350 of FIGS. 1, 3, and 6 except that pitches P8 to P9 of unit substrate regions in strip STR1 or STR2 or in strip group STRG are sequentially varied according to portions thereof. Thus, description provided above with reference to FIGS. 1, 3, and 6 will be omitted or simplified below.

The substrate structure 400 may include a base substrate 402, unit substrate regions 404a and 404b, and dummy substrate regions 406. The base substrate 402 may correspond to the base substrates 102, 202, and 352 of FIGS. 1, 3, and 6. The unit substrate regions 404a and 404b may correspond to the unit substrate regions 104a, 104b, 204b, 204b, 354a, and 354b of FIGS. 1, 3, and 6. The dummy substrate regions 406 may correspond to the dummy substrate regions 106, 206, and 356 of FIGS. 1, 3, and 6.

The plurality of unit substrate regions 404a and 404b may be disposed on the base substrate 402. The unit substrate regions 404a and 404b may be arranged on the base substrate 402 in a row direction (X direction) and a column direction (Y direction) and may be spaced apart from each other. The unit substrate regions 404a and 404b may be arranged in a plurality of strips STR1 and STR2 in at least one of the row direction and the column direction, for example, in the row direction. In addition, the plurality of strips STR1 and STR2 may be grouped into a strip group STRG.

In FIG. 7, each strip (one of the strips STR1 and STR2) and the strip group STRG are aligned in one of the row direction and the column direction, for example, in the row direction, and the plurality of strips STR1 and STR2 are disposed in one of the row direction and the column direction, for example, in the column direction. In FIG. 7, one strip group STRG is illustrated for convenience.

The strips STR1 and STR2 and the strip group STRG may be divided into a central portion CP and edge portions EP in at least one of the column direction and the row direction, for example, in the row direction. Also, the base substrate 402 may be divided into the central portion CP and the edge portions EP in at least one of the column direction and the row direction, for example, in the row direction. In example embodiments, the central portion CP of the base substrate 402 may refer to a portion which includes one or more unit substrate regions 404a disposed symmetrically with respect to and near a central line of the base substrate 402 in a row direction. Each of the edge portions EP of the base substrate 402 may refer to a portion which includes one or more unit substrate regions 404b disposed between one end line of the base substrate 402 and the central portion CP of the base substrate 402 in the row direction. The central line of the base substrate 402 may be located on portions of unit substrate regions 404a or on a portion of the dummy substrate regions 406.

For example, the pitches P8 to P9 between central points of the two adjacent unit substrate regions 404a and 404b may be different according to portions of one strip (one of the strips STR1 and STR2) or one strip group STRG in one of the row direction and the column direction, for example, in the row direction. For example, the pitches P9, P8.9, P8.1, and P8 between central points of the two adjacent unit substrate regions 404a and 404b may sequentially decrease in one strip (one of the strips STR1 and STR2) and one strip group STRG from the central portion CP to each of the edge portions EP of the base substrate 402.

For example, in a strip (e.g., one of the strips STR1 and STR2) or a strip group STRG, pitches between central points of the two adjacent unit substrates 404a, which are located in the central portion CP of the base substrate 402, may be the pitch P9 and the pitch P8.9 on the right side and left side of the pitch P9, and distances between the substrate regions 404a may be a distance S9 and a distance S8.9 on the right side and left side of the distance S9. Further, in a strip (e.g., one of the strips STR1 and STR2) or a strip group STRG, pitches between central points of the two adjacent unit substrate regions 404b, which are located in the edge portions EP of the base substrate 402, may be the pitch P8.1 and the pitch P8 on the left side and the right side of the pitch P8.1.

As described above, in the substrate structure 400, sequentially decreasing pitches from the pitch P9 to the pitch P8 may be set between the central points of the two adjacent unit substrate regions 404a and 404b from the central portion CP to the edge portions EP of the base substrate 402 in at least one of the column direction and the row direction, for example, in the row direction, in one strip (one of the strips STR1 and STR2) and one strip group STRG.

Accordingly, according to the substrate structure 400, warpage of the base substrate 402, the strips STR1 and STR2, and the strip group STRG may be reduced or prevented by adjusting a difference in coefficients of thermal expansion of the unit substrate regions 404a and 404b located on the base substrate 402, the strips STR1 and STR2, and the strip group STRG when performing subsequent processes.

Figure 8:
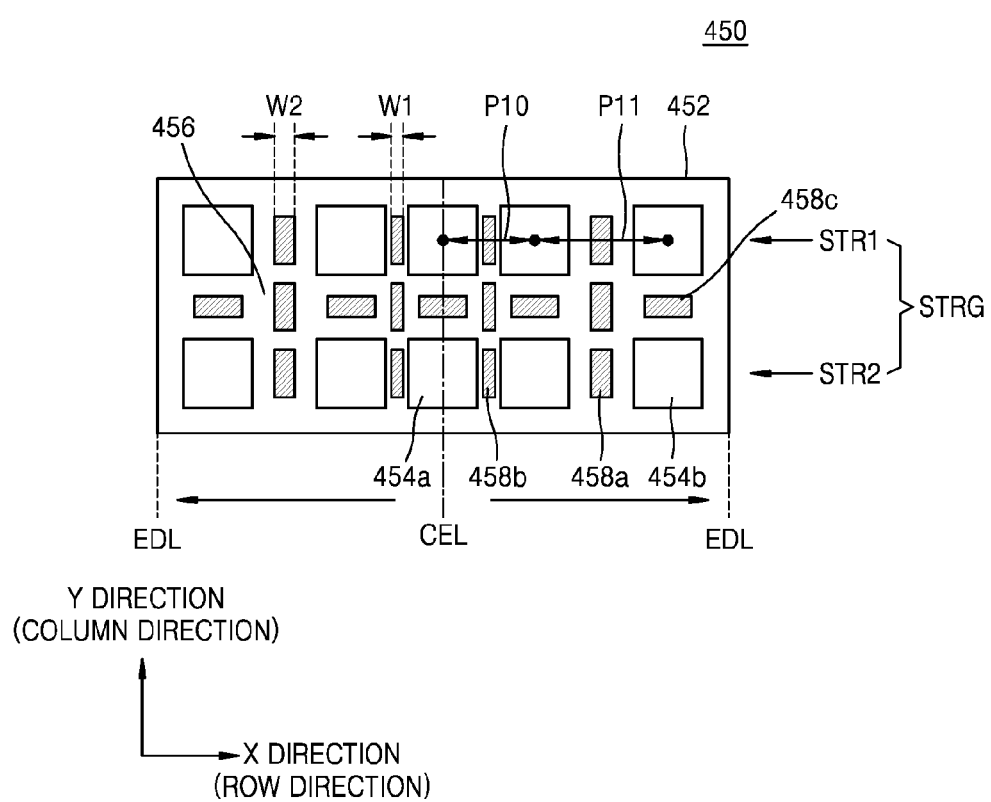
FIG. 8 is a partial plan view of a substrate structure according to an exemplary embodiment of the inventive concept.

FIG. 8 is a partial plane view illustrating a substrate structure 450 according to an exemplary embodiment of the inventive concept.

The substrate structure 450 may be the same as the substrate structures 100, 200, and 250 of FIGS. 1, 3, and 4 except that pitches P10 and P11 of unit substrate regions sequentially increase from a central line CEL of a base substrate 452 to an edge line EDL of the base substrate 452 in strip STR1 or STR2 or in strip group STRG, and that slots 458a and 458b are formed in dummy substrate regions. Thus, description provided above with reference to FIGS. 1, 3, and 4 will be omitted or simplified below.

The substrate structure 450 may include the base substrate 452, unit substrate regions 454a and 454b, and dummy substrate regions 456. The base substrate 452 may correspond to the base substrates 102, 202, and 252 of FIGS. 1, 3, and 4. The unit substrate regions 454a and 454b may correspond to the unit substrate regions 104a, 104b, 204b, 204b, 254a, and 254b of FIGS. 1, 3, and 4. The dummy substrate regions 456 may correspond to the dummy substrate regions 106, 206, and 256 of FIGS. 1, 3, and 4.

The plurality of unit substrate regions 454a and 454b may be disposed on the base substrate 452. The unit substrate regions 454a and 454b may be arranged on the base substrate 452 in a row direction (X direction) and a column direction (Y direction) and may be spaced apart from each other. The unit substrate regions 454a and 454b may be arranged in a plurality of strips STR1 and STR2 aligned in at least one of the row direction and the column direction, for example, in the row direction. In addition, the plurality of strips STR1 and STR2 may be grouped into a strip group STRG.

In FIG. 8, each of the strips (one of the strips STR1 and STR2) and the strip group STRG are aligned in one of the row direction and the column direction, for example, in the row direction, and the plurality of strips STR1 and STR2 are disposed in one of the row direction and the column direction, for example, in the column direction. In FIG. 8, one strip group STRG is illustrated for convenience.

The central line CEL of the base substrate 452 may be in the middle of the strips STR1 and STR2 or the strip group STRG in at least one of the column direction and the row direction, for example, in the row direction, and the edge lines EDL of the base substrate 452 may be at ends of the strips STR1 and STR2 or the strip group STRG in at least one of the column direction and the row direction, for example, in the row direction. Also, the central line CEL may be in a middle of the base substrate 452 in at least one of the column direction and the row direction, for example, in the row direction, and the edge lines EDL may be at edges of the base substrate 452. In FIG. 8, only unit substrate regions 454a and 454b are illustrated between the central line CEL and the edge lines EDL.

The pitches P10 and P11 between the central points of the two adjacent unit substrate regions 454a and 454b may be different according to portions of one strip (one of the strips STR1 and STR2) or one strip group STRG in one of the row direction and the column direction, for example, in the row direction.

For example, the pitches P10 and P11 between the central points of the two adjacent unit substrate regions 454a and 454b may sequentially increase in one strip (one of the strips STR1 and STR2) and one strip group STRG from the central line CEL to each of the edge lines EDL of the base substrate 452.

For example, a pitch between central points of a unit substrate region 454a at the central line CEL and a unit substrate region 454b adjacent to the unit substrate region 454a in one strip (one of the strips STR1 and STR2) and one strip group STRG may be the pitch P10, and a pitch between central points of the two adjacent unit substrate regions (454b) at the edge line EDL may be the pitch P11 that is greater than the pitch P10.

In addition, the slots 458a, 458b and 458c are formed in the dummy substrate regions 456 of the substrate structure 450 in at least one of the row direction or the column direction. The slots 458a, 458b and 458c may be grooves or through holes formed in the base substrate 452. Widths W1 and W2 of the slots 458a and 458b may be different in at least one direction. The width W2 of each of the slots 458a may be greater than the width W1 of each of the slots 458b. The slots 458a, 458b and 458c may facilitate reduction of warpage of the base substrate 452.

As described above, in a strip (one of the strips STR1 and STR2) or a strip group STRG in the substrate structure 450, pitches P10 and P11 may be set between the central points of the two adjacent unit substrate regions 454a and 454b, respectively, in at least one of the column direction and the row direction, for example, in the row direction such that the pitches P10 and P11 increase from the central line CEL to each of the edge lines EDL of the base substrate 452. In addition, the substrate structure 450 may include the slots 458a, 458b and 458c in the dummy substrate regions 456 in at least one of the row direction or the column direction.

According to the substrate structure 450, warpage of the base substrate 452, the strips STR1 and STR2, and the strip group STRG may be reduced or prevented by adjusting a difference in coefficients of thermal expansion of the unit substrate regions 454a and 454b located on the base substrate 452, the strips STR1 and STR2, and the strip groups STRG when performing subsequent processes.

Figure 9:
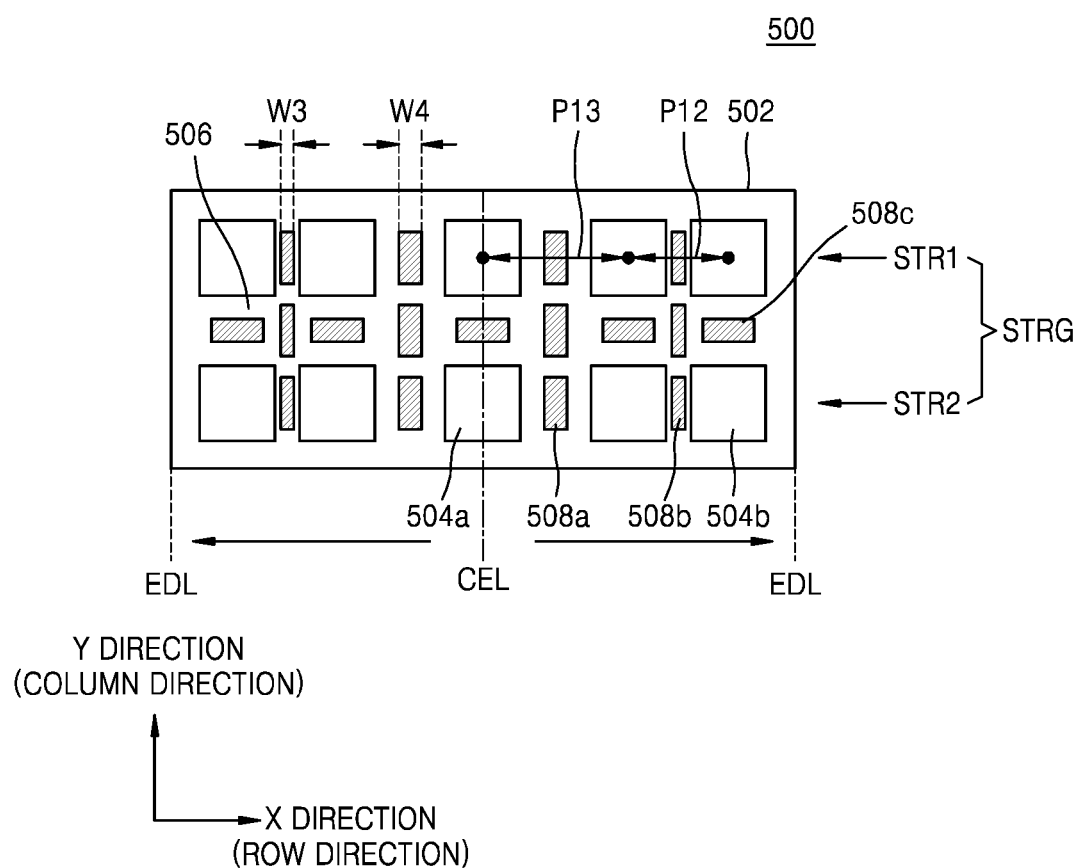
FIG. 9 is a partial plan view of a substrate structure according to an exemplary embodiment of the inventive concept.

FIG. 9 is a partial plane view illustrating a substrate structure 500 according to an exemplary embodiment of the inventive concept.

The substrate structure 500 may be the same as the substrate structures 100, 200, 400, and 450 of FIGS. 1, 3, 7, and 8 except that pitches P12 and P13 of unit substrate regions in strip STR1 or STR2 or in strip group STRG are reduced from a central line to an edge line, and that slots 508a and 508b are formed in the dummy substrate regions 506. Thus, description provided above with reference to FIGS. 1, 3, 7, and 8 will be omitted or simplified below.

The substrate structure 500 may include a base substrate 502, unit substrate regions 504a and 504b, and dummy substrate regions 506. The base substrate 502 may correspond to the base substrates 102, 202, 402, and 452 of FIGS. 1, 3, 7, and 8. The unit substrate regions 504a and 504b may correspond to the unit substrate regions 104a, 104b, 204a, 204b, 404a, 402b, 454a, and 454b of FIGS. 1, 3, 7, and 8. The dummy substrate regions 506 may correspond to the dummy substrate regions 106, 206, 406, 456 of FIGS. 1, 3, 7, and 8.

The plurality of unit substrate regions 504a and 504b may be disposed on the base substrate 502. The unit substrate regions 504a and 504b may be arranged on the base substrate 502 in a row direction (X direction) and a column direction (Y direction) and may be spaced apart from each other. The unit substrate regions 504a and 504b may be arranged in a plurality of strips STR1 and STR2 in at least one of the row direction and the column direction, for example, in the row direction. In addition, the plurality of strips STR1 and STR2 may be grouped into a strip group STRG.

In FIG. 9, each strip (one of the strips STR1 and STR2) and the strip group STRG are aligned in one of the row direction and the column direction, for example, in the row direction, and the plurality of strips STR1 and STR2 are disposed in one of the row direction and the column direction, for example, in the column direction. In FIG. 9, one strip group STRG is illustrated for convenience.

A central line CEL of the base substrate 502 may be in the middle of the strips STR1 and STR2 or the strip group STRG in at least one of the column direction and the row direction, for example, in the row direction, and edge lines EDL of the base substrate 502 may be at ends of the strips STR1 and STR2 or the strip group STRG in at least one of the column direction and the row direction, for example, in the row direction. Also, the central line CEL may be in a middle of the base substrate 502 in at least one of the column direction and the row direction, for example, in the row direction, and the edge lines EDL may be at edges of the base substrate 502. In FIG. 9, only unit substrate regions 504a and 504b are illustrated between the central line CEL and the edge lines EDL for convenience.

The pitches P12 and P13 between central points of the two adjacent unit substrate regions 504a and 504b may be different according to portions of one strip (one of the strips STR1 and STR2) or strip group STRG in one of the row direction and the column direction, for example, in the row direction.

For example, the pitches P12 and P13 between central points of the two adjacent unit substrate regions 504a and 504b in one strip (one of the strips STR1 and STR2) and one strip group STRG may decrease from the central line CEL to the edge line EDL of the base substrate 502.

For example, a pitch between central points of the two adjacent unit substrate regions 504a at the central line CEL in one strip (one of the strips STR1 and STR2) and one strip group STRG may be the pitch P13, and a pitch between central points of the two adjacent unit substrate regions at the edge line EDL may be the pitch P12 that is smaller than the pitch P13.

In addition, the slots 508a, 508b and 508c are formed in the dummy substrate regions 506 of the substrate structure 500 in at least one of the row direction and the column direction. The slots 508a, 508b and 508v may be grooves or through holes formed in the base substrate 502. Widths W3 and W4 of the slots 508a and 508b may be different in at least one direction. The width W4 of the slots 508a may be greater than the width W3 of the slots 508b. The slots 508a, 508b and 508c may facilitate reduction of warpage of the base substrate 502.

As described above, in a strip (one of the strips STR1 and STR2) or a strip group STRG in the substrate structure 500, pitches P13 and P12 may be set between the central points of the two adjacent unit substrate regions 504a and 504b, respectively, in at least one of the column direction and the row direction, for example, in the row direction such that the pitches P13 and P12 decrease from the central line CEL to the edge line EDL of the base substrate 502. In addition, the substrate structure 500 may include the slots 508a and 508b in the dummy substrate regions 506 in at least one of the row direction and the column direction.

Accordingly, according to the substrate structure 500, warpage of the base substrate 502, the strips STR1 and STR2, and the strip group STRG may be reduced or prevented by adjusting a difference in coefficients of thermal expansion of the unit substrate regions 504a and 504b located on the base substrate 502, the strips STR1 and STR2, and the strip group STRG when performing subsequent processes.

Figure 10:
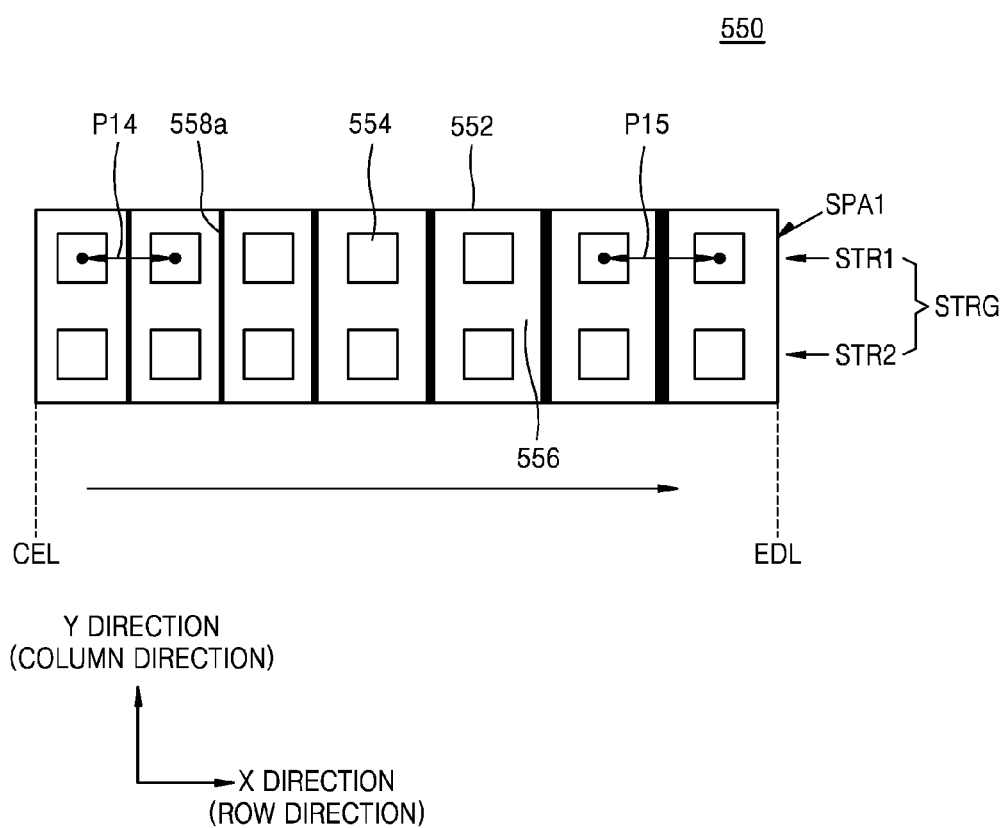
FIGS. 10 and 11 are partial plan views of a substrate structure according to exemplary embodiments of the inventive concept.
Figure 11:
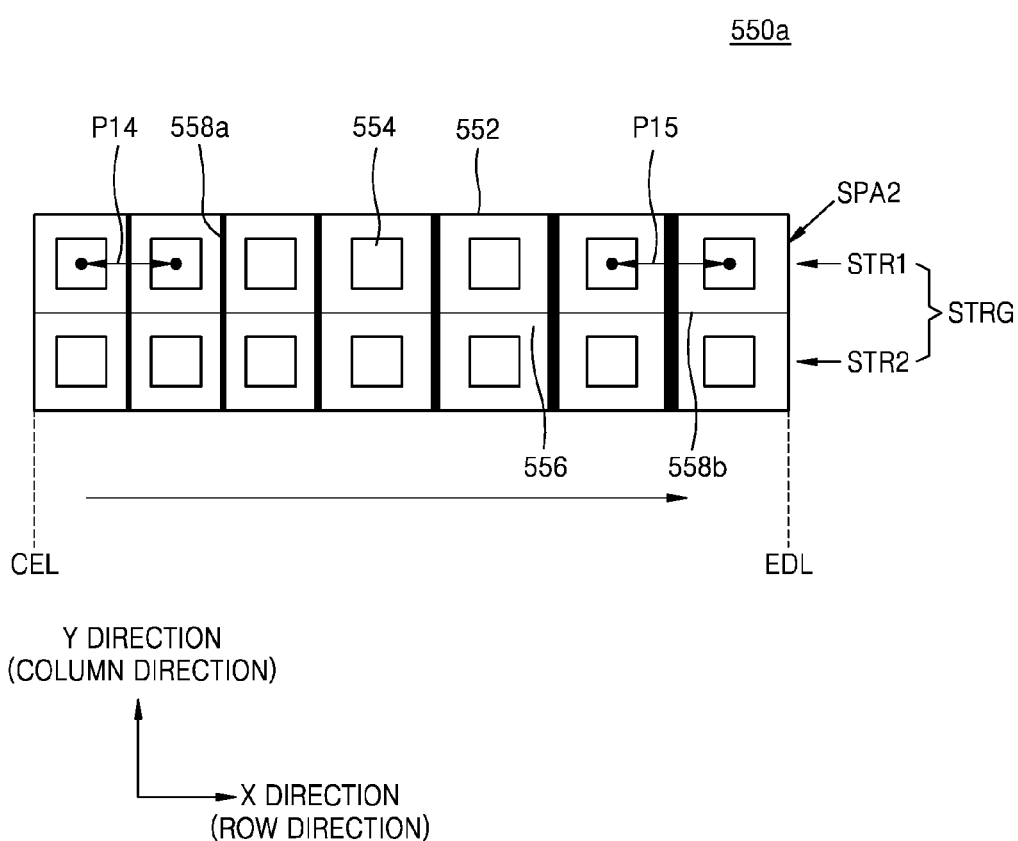

FIGS. 10 and 11 are partial plane views illustrating substrate structures 550 and 550a according to exemplary embodiments of the inventive concept.

The substrate structures 550 and 550a may be the same as the substrate structures 100, 200, and 450 of FIGS. 1, 3, and 8 except that pitches P14 and P15 of unit substrate regions sequentially increase from a central line CEL of the base substrate 552 to an edge line EDL of the base substrate 552 in strip STR1 or STR2 or in strip group STRG, and that cutting lines 558a and 558b are indicated. Thus, description provided above with reference to FIGS. 1, 3, and 8 will be omitted or simplified below.

The substrate structures 550 and 550a may include a base substrate 552, unit substrate regions 554, and dummy substrate regions 556. The base substrate 552 may correspond to the base substrates 102, 202, and 452 of FIGS. 1, 3, and 8. The unit substrate regions 554 may correspond to the unit substrate regions 104a, 104b, 204a, 204b, 454a, and 454b of FIGS. 1, 3, and 8. The dummy substrate regions 556 may correspond to the dummy substrate regions 106, 206, and 456 of FIGS. 1, 3, and 8.

The plurality of unit substrate regions 554 may be disposed on the base substrate 552. The unit substrate regions 554 may be arranged on the base substrate 552 in a row direction (X direction) and a column direction (Y direction) and may be spaced apart from each other. The unit substrate regions 554 may be arranged in a plurality of strips STR1 and STR2 aligned in at least one of the row direction and the column direction, for example, in the row direction. In addition, the plurality of strips STR1 and STR2 may be grouped into a strip group STRG.

In FIGS. 10 and 11, each strip (one of the strips STR1 and STR2) and the strip group STRG are aligned in one of the row direction and the column direction, for example, in the row direction, and the plurality of strips STR1 and STR2 are disposed in one of the row direction and the column direction, for example, in the column direction. In FIGS. 10 and 11, one strip group STRG is illustrated for convenience.

A central line CEL of the base substrate 552 may be in the middle of the strips STR1 and STR2 or the strip group STRG in at least one of the column direction and the row direction, for example, in the row direction, and an edge line EDL of the base substrate 552 may be at ends of the strips STR1 and STR2 or the strip group STRG in at least one of the column direction and the row direction, for example, in the row direction. Also, the central line CEL of the base substrate 552 may be in the middle of the base substrate 552 in at least one of the column direction and the row direction, for example, in the row direction, and the edge line EDL of the base substrate 552 may be at ends of the base substrate 552.

The pitches P14 and P15 between central points of the two adjacent unit substrate regions 554 may be different according to portions of one strip (one of the strips STR1 and STR2) or one strip group STRG in one of the row direction and the column direction, for example, in the row direction. For example, the pitches P14 and P15 between the central points of the two adjacent unit substrate regions 554 in one strip (one of the strips STR1 and STR2) and one strip group STRG may sequentially increase from the central line CEL to the edge line EDL of the base substrate 552.

For example, a pitch between central points of the unit substrate regions 554 at the central line CEL in one strip (one of the strips STR1 and STR2) and one strip group STRG may be the pitch P14, and a pitch between central points of the two adjacent unit substrate regions at the edge line EDL may be the pitch P15 that is greater than the pitch P14.

In addition, in the substrate structure 550 of FIG. 10, the cutting line 558a is installed on the base substrate 552 in one of the row direction and the column direction, for example, in the column direction. The cutting line 558a may have a width in the row direction increasing from the central line CEL to the edge line EDL of the base substrate 552. When the substrate structure 550 of FIG. 10 is used, a unit substrate structure SPA1 including the plurality of unit substrate regions 554 may be obtained. While one cutting line 558a is displayed in the column direction in FIG. 10 for convenience, according to necessity, the cutting line 558b may also be indicated in the row direction as illustrated in FIG. 11.

In some embodiments, the base substrate 552 may be cut using by a laser beam. In example embodiments, a first cutting line 558a having a first width in the row direction between the two first semiconductor chips may be cut by a first laser beam having a first width, and a second cutting line 558a having a second width in the row direction greater than the first width of the first cutting line 558a between the two first semiconductor chips may be cut by a second laser beam having a second width grater than the first width of the first laser beam. In other examples, a first cutting line 558a having a first width in the row direction between the two first semiconductor chips may be cut in a single cut (e.g., by a laser having a width of the first cutting line 558a), and a second cutting line 558a having a second width in the row direction greater than the first width of the first cutting line 558a between the two first semiconductor chips may be cut in two cuts, one at either edge of the second cutting line 558a (e.g., by a laser having a width smaller than the second cutting line 558a).

In example embodiments, in the substrate structure 550a of FIG. 11, compared to the exemplary embodiment of FIG. 10, the cutting line 558b is installed on the base substrate 552 along one of the row direction and the column direction, for example, in the row direction. Accordingly, when the substrate structure 550a of FIG. 11 is used, a unit substrate structure SPA2 including one unit substrate region 554 may be obtained.

Figure 12:
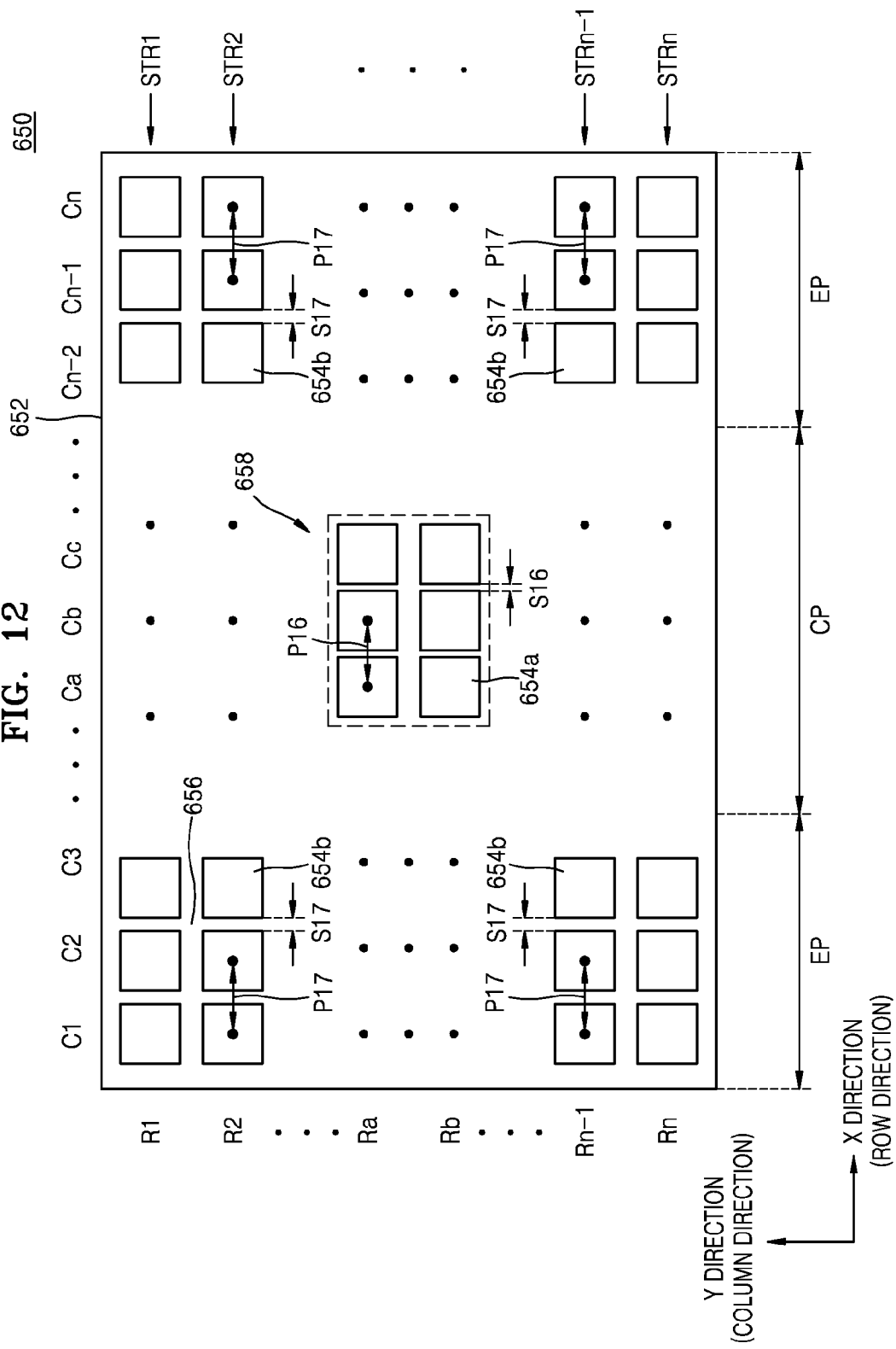
FIG. 12 is a partial plan view of a substrate structure according to an exemplary embodiment of the inventive concept.

FIG. 12 is a partial plane view illustrating a substrate structure 650 according to an exemplary embodiment of the inventive concept.

The substrate structure 650 may be the same as the substrate structure 100 of FIG. 1 except that a unit substrate region group 658 including unit substrate regions 654a having a pitch P16 that is locally different from other regions is disposed on a portion of the base substrate 652. Thus, description provided above with reference to FIG. 1 will be omitted or simplified below.

The substrate structure 650 may include a base substrate 652, unit substrate regions 654a and 654b, and dummy substrate regions 656. The base substrate 652 may correspond to the base substrate 102 of FIG. 1. The unit substrate regions 654a and 654b may correspond to the unit substrate regions 104a and 104b of FIG. 1. The dummy substrate regions 656 may correspond to the dummy substrate regions 106 of FIG. 1.

The unit substrate regions 654a and 654b may be arranged on the base substrate 652 in a row direction (X direction) and a column direction (Y direction) and may be spaced apart from each other. For example, a size of each of the unit substrate regions 654a and 654b may be equal to each other. R1 to Rn (n is an integer) unit substrate regions 654a and 654b may be disposed in the column direction, and C1 to Cn (n is an integer) unit substrate regions 654a and 654b may be disposed in the row direction. Although FIG. 12 shows that a number of rows (i.e., R1 to Rn) and a number of columns (i.e., C1 to Cn) are equal, in other embodiments, the numbers of rows and columns may be different from each other. The number of unit substrate regions 654a and 654b may be set according to necessity.

The unit substrate regions 654a and 654b may be arranged in a plurality of strips STR1 to STRn (n is an integer) aligned in at least one of the row direction and the column direction. The strips STR1 to STRn (n is an integer) may be spaced apart from one another in at least one of the row direction and the column direction, for example, in the row direction.

In FIG. 12, each of the strips STR1 to STRn (one of the strips STR1 to STRn, n is an integer) is aligned in at least one of the row direction and the column direction, for example, in the column direction, and the plurality of strips STR1 to STRn (n is an integer) are arranged in at least one of the row direction and the column direction, for example, in the row direction.

A pitch between central points of the two adjacent unit substrate regions 654b of the strips STR1 to STRn (n is an integer) may be a pitch P17, and a distance between the two adjacent unit substrate regions 654b may be a distance S17. In example embodiments, the unit substrate region group 658 including the unit substrate regions 654a is disposed in a portion of the base substrate 652, that is, in rows Ra and Rb and in columns Ca to Cc.

The unit substrate region group 658 may be formed by grouping the unit substrate regions 654a into a group on a portion of the base substrate 652. The unit substrate region group 658 may be disposed on a portion of at least one of the strips STR1 to STRn (n is an integer). The unit substrate region group 658 may be disposed on a plurality of strips in a row direction Ra and a row direction Rb. The pitch P16 between central points of the two adjacent unit substrate regions 654a included in the unit substrate region group 658 may be different from the pitch P17 between central points of the two adjacent unit substrate regions 654b not included in the unit substrate region group 658.

For example, a pitch between the central points of the two adjacent unit substrate regions 654a included in the unit substrate region group 658 may be the pitch P16 that is smaller than the pitch P17. The distance between the two adjacent unit substrate regions 654a included in the unit substrate region group 658 may be a distance S16 that is smaller than the distance S17. In example embodiments, a pitch between the central points of the two adjacent unit substrate regions 654a included in the unit substrate region group 658 may be greater than the pitch P17.

The strips STR1 to STRn (n is an integer) may be divided into a central portion CP and edge portions EP in at least one of a column direction and a row direction, for example, in the column direction. Also, the base substrate 652 may be divided into the central portion CP and the edge portions EP in at least one of a column direction and a row direction, for example, in the column direction. The unit substrate region group 658 may be located in a middle portion of the central portion CP of the strips STR1 to STRn (n is an integer) and the base substrate 652. In example embodiments, the central portion CP of the base substrate 652 may refer to a portion which includes one or more unit substrate regions 654a disposed symmetrically with respect to and near a central line of the base substrate 652 in a row direction. Each of the edge portions EP of the base substrate 652 may refer to a portion which includes one or more unit substrate regions 654b disposed between one end line of the base substrate 652 and the central portion CP of the base substrate 652 in the row direction. The central line of the base substrate 652 may be located on portions of unit substrate regions 654a or on a portion of the dummy substrate regions 656.

As described above, in the substrate structure 650, the unit substrate region group 658 may be formed on a portion of the strips STR1 to STRn (n is an integer), and the pitch P16 between the central points of the two adjacent unit substrate regions 654a included in the unit substrate region group 658 may be differently set from other portions besides the unit substrate region group 658.

According to the substrate structure 650, warpage of the base substrate 652 or the strips STR1 to STRn (n is an integer) may be reduced or prevented by adjusting a difference in coefficients of thermal expansion of the unit substrate regions 654a and 654b located on the base substrate 652 or the strips STR1 to STRn (n is an integer) when performing subsequent processes.

Figure 13:
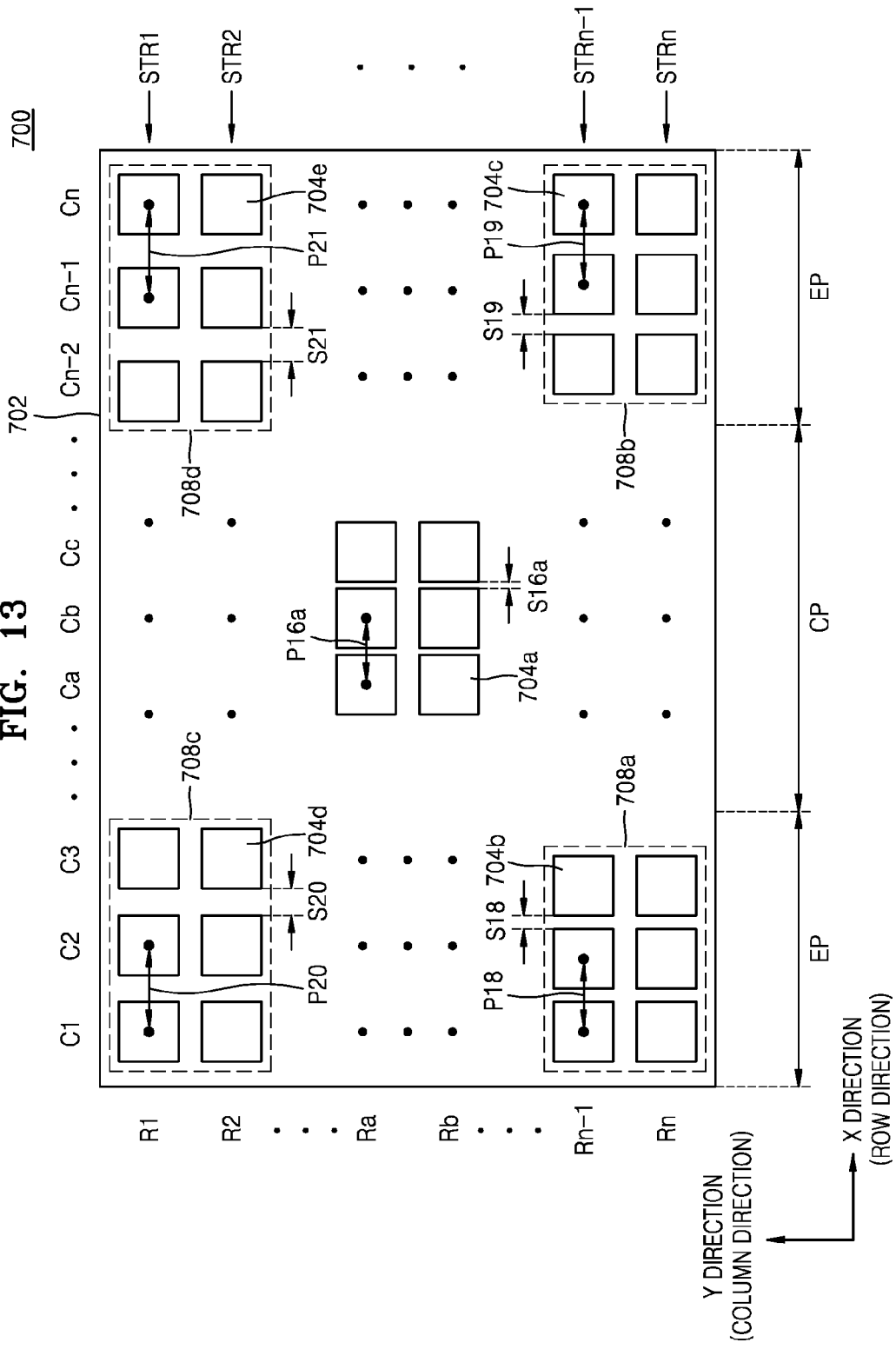
FIG. 13 is a partial plan view of a substrate structure according to an exemplary embodiment of the inventive concept.

FIG. 13 is a partial plane view illustrating a substrate structure 700 according to an exemplary embodiment of the inventive concept.

The substrate structure 700 may be the same as the substrate structures 100 and 650 of FIGS. 1 and 12 except that unit substrate region group 708a to 708d including unit substrate regions 704b to 704e having locally different pitches P18 to P21 from other regions are disposed on some portions of the base substrate 702. Thus, description provided above with reference to FIGS. 1 and 12 will be omitted or simplified below.

The substrate structure 700 may include the base substrate 702, the unit substrate regions 704a to 704e, and dummy substrate regions 706. The base substrate 702 may correspond to the base substrates 102 and 652 of FIGS. 1 and 12. The unit substrate regions 704a to 704e may correspond to the unit substrate regions 104a, 104b, 654a, and 654b of FIGS. 1 and 12. The dummy substrate regions 706 may correspond to the dummy substrate regions 106 and 656 of FIGS. 1 and 12.

The unit substrate regions 704a to 704e may be arranged on the base substrate 702 in a row direction (X direction) and a column direction (Y direction) and may be spaced apart from each other. For example, a size of each of the unit substrate regions 704a to 704e may be equal to each other. R1 to Rn (n is an integer) unit substrate regions 704a to 704e may be disposed in the column direction, and C1 to Cn (n is an integer) unit substrate regions 704a to 704e may be disposed in the row direction. Although FIG. 13 shows that a number of rows (i.e., R1 to Rn) and a number of columns (i.e., C1 to Cn) are equal, in other embodiments, the numbers of rows and columns may be different from each other. The number of unit substrate regions 704a to 704e may be set according to necessity.

The unit substrate regions 704a to 704e may be arranged in a plurality of strips STR1 to STRn (n is an integer) arranged in at least one of the row direction and the column direction. The strips STR1 to STRn (n is an integer) may be spaced apart from one another in at least one of the row direction and the column direction, for example, in the row direction.

In FIG. 13, each of the strips STR1 to STRn (one of the strips STR1 to STRn, n is an integer) is aligned in one of the row direction and the column direction, for example, in the column direction, and the plurality of strips STR1 to STRn (n is an integer) are arranged in one of the row direction and the column direction, for example, in the row direction.

A pitch between central points of the two adjacent unit substrate regions 704a of the strips STR1 to STRn (n is an integer) may be a pitch P16a, and a distance between the two adjacent unit substrate regions 704a may be a distance S16a. In example embodiments, unit substrate region groups 708a to 708d including the unit substrate regions 704b to 704e, respectively, are disposed at four corners of the base substrate 702.

The unit substrate region groups 708a to 708d may be formed by grouping the unit substrate regions 704b to 704e into groups on portions of the base substrate 702. The unit substrate region groups 708a to 708d may be each disposed on a portion of at least one of the strips STR1 to STRn (n is an integer) (e.g., two strips). Pitches P18 to P21 between central points of the two adjacent unit substrate regions 704b to 704e included in the unit substrate region groups 708a to 708d may be different from one another. The unit substrate region groups 708a to 708d may be spaced apart from one another in the row direction or the column direction.

The pitches P18 to P21 between the central points of the two adjacent unit substrate regions 704b to 704e included in the unit substrate region groups 708a to 708d may be different from one another. The pitches P18 to P21 between the central points of the two adjacent unit substrate regions 704b to 704e included in the unit substrate region groups 708a to 708d may be different from the pitch P16a between the central points of the two adjacent unit substrate regions 704a that are not included in the unit substrate region groups 708a to 708d.

For example, a pitch between the central points of the two adjacent unit substrate regions 704b to 704e included in the unit substrate region groups 708a to 708d may be the pitches P18 to P21 that are greater than the pitch P16a. The pitches P18, P19, P20, and P21 between the central points of the two adjacent unit substrate regions 704b, 704c, 704d, and 704e respectively included in the unit substrate region groups 708a, 708b, 708c, and 708d may increase in an order of P18<P19<P20<P21. The distance between the two adjacent unit substrate regions 704b to 704e included in the unit substrate region groups 708a to 708d may be distances S18 to S21 that are greater than the distance S16a.

As described above, in the substrate structure 700, the unit substrate region groups 708a to 708d may be formed on portions of the strips STR1 to STRn (n is an integer), and the pitches P18 to P21 between the central points of the two adjacent unit substrate regions 704b to 704e included in the unit substrate region groups 708a to 708d may be differently set from pitches of other portions than the unit substrate region groups 708a to 708d.

According to the substrate structure 700, warpage of the base substrate 702 or the strips STR1 to STRn (n is an integer) may be reduced or prevented by adjusting a difference in coefficients of thermal expansion of the unit substrate regions 704a to 704e located on the base substrate 702 or the strips STR1 to STRn when performing subsequent processes.

Figure 14:
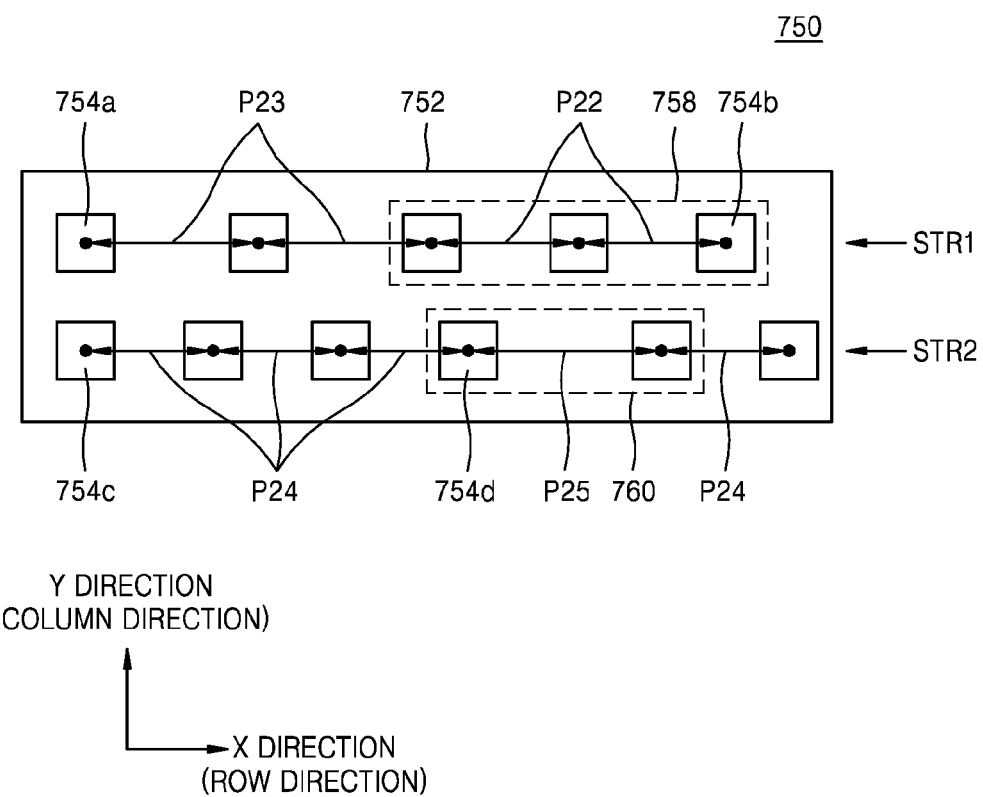
FIG. 14 is a partial plan view of a substrate structure according to an exemplary embodiment of the inventive concept.

FIG. 14 is a partial plane view illustrating a substrate structure 750 according to an exemplary embodiment of the inventive concept.

The substrate structure 750 may be the same as the substrate structures 100, 650, and 700 of FIGS. 1, 12, and 13 except that unit substrate region group 758 and 760 including unit substrate regions 754b and 754d having locally different pitches P22 to P25 from other portions are disposed on strip STR1 or STR2 of the base substrate 752. Thus, description provided above with reference to FIGS. 1, 12, and 13 will be omitted or simplified below.

The substrate structure 750 may include the base substrate 752, unit substrate regions 754a to 754d, and dummy substrate regions 756. The base substrate 752 may correspond to the base substrates 102, 652, and 702 of FIGS. 1, 12, and 13. The unit substrate regions 754a to 754d may correspond to the unit substrate regions 104a, 104b, 654a, 654b, and 704a to 704e of FIGS. 1, 12, and 13. The dummy substrate regions 756 may correspond to the dummy substrate regions 106, 656, and 706 of FIGS. 1, 12, and 13.

The unit substrate regions 754a to 754d may be arranged on the base substrate 752 in a row direction (X direction) and a column direction (Y direction) and may be spaced apart from each other. The unit substrate regions 754a to 754d may be arranged in a plurality of strips STR1 and STR2 arranged in at least one of the row direction and the column direction, for example, in the row direction. The strips STR1 and STR2 may be aligned in at least one of the row direction and the column direction, for example, in the row direction.

A pitch between central points of the two adjacent unit substrate regions 754a of the strip STR1 is a pitch P23. In example embodiments, a unit substrate region group 758 including three unit substrate regions 754b having a pitch P22 smaller than the pitch P23 between central points thereof are disposed on a portion of the base substrate 752 in the strip STR1. In other embodiments, the pitch P22 may be greater than the pitch P23.

A pitch between central points of the two adjacent unit substrate regions 754c of the strip STR2 is a pitch P24. In example embodiments, a unit substrate region group 760 including two unit substrate regions 754d having a pitch P25 greater than the pitch P24 between central points thereof is disposed on a portion of the base substrate 752 in the strip STR2. In other embodiments, the pitch P25 may be smaller than the pitch P24.

The unit substrate region groups 758 and 760 may be formed by grouping the unit substrate regions 754b and 754d on portions of the base substrate 752. The unit substrate region groups 758 and 760 may be each disposed on a portion of one of the strips STR1 and STR2. The pitches P22 and P25 between the central points of the two adjacent unit substrate regions 754b and 754d may be different according to the unit substrate region groups 758 and 760 in the strips STR1 and STR2. The unit substrate region groups 758 and 760 may be spaced apart from each other in the column direction.

As described above, in the substrate structure 750, the unit substrate region groups 758 and 760 may be formed on a portion of each of the strips STR1 and STR2, and the pitches P22 and P25 between the central points of the two adjacent unit substrate regions 754*b* and 754*d* included in the unit substrate region groups 758 and 760 may be respectively differently set from pitches of other portions than the unit substrate region groups 758 and 760.

According to the substrate structure 750, warpage of the base substrate 752 or the strips STR1 and STR2 may be reduced or prevented by adjusting a difference in coefficients of thermal expansion of the unit substrate regions 754*a* to 754*d* located on the base substrate 752 or the strips STR1 and STR2 when performing subsequent processes.

Figure 15:
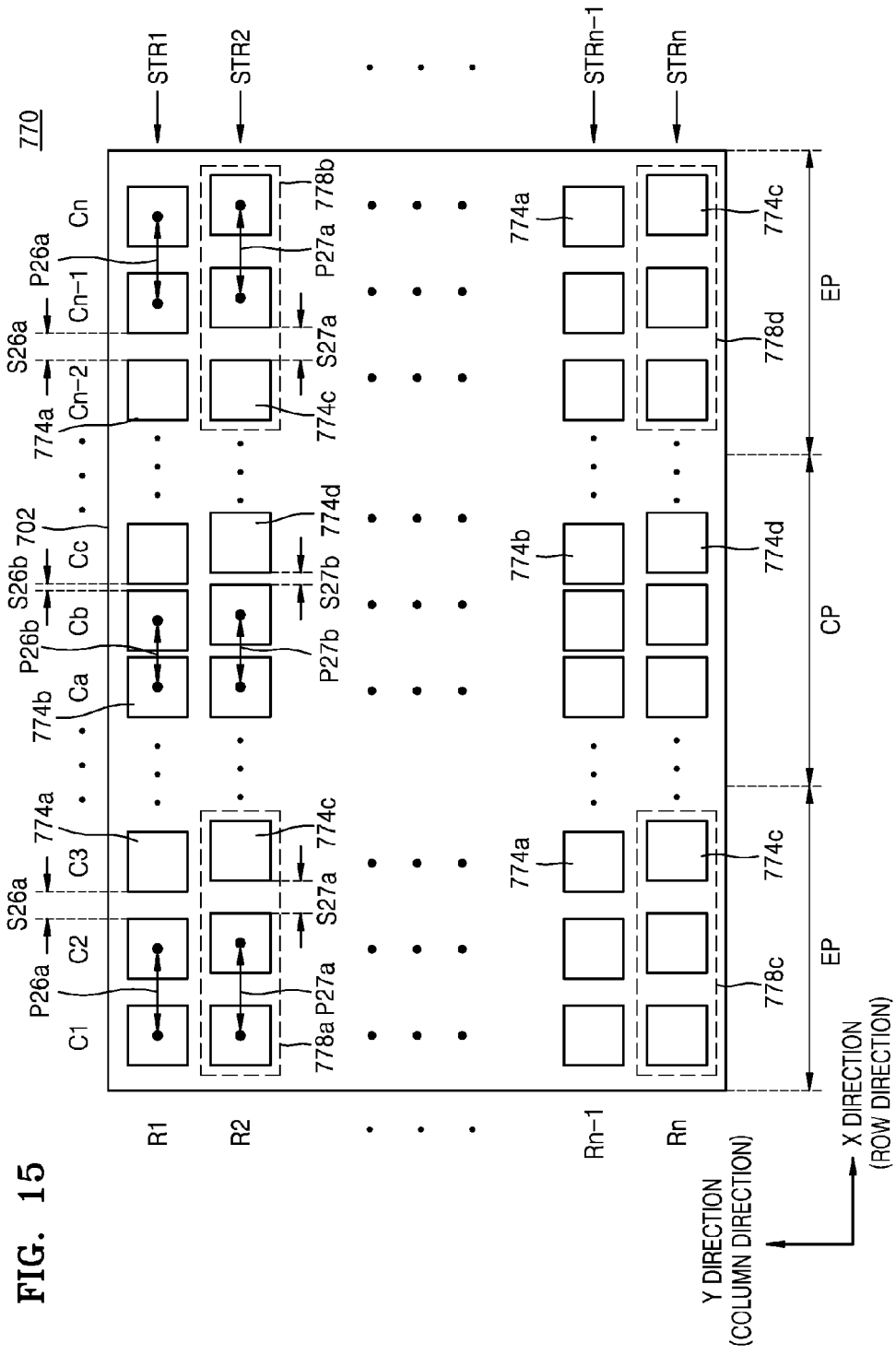
FIG. 15 is a partial plan view of a substrate structure according to an exemplary embodiment of the inventive concept.

FIG. 15 is a partial plane view of a substrate structure 770 according to an exemplary embodiment of the inventive concept.

The substrate structure 770 may be the same as the substrate structures 100, 700, and 750 of FIGS. 1, 13, and 14 except that unit substrate regions 774*a* (or 774*b*) and 774*c* (or 774*d*) are included, which have pitches P26*a* (or P26*b*) and P27*a* (or P27*b*) that are different according to strips STR1 to STRn (n is an integer) located on a base substrate 772, and that unit substrate region groups 778*a* to 778*d* including the unit substrate regions 774*a*, 774*b*, 774*c*, and 774*d* having the pitches P26*a*, P26*b*, P27*a*, and P27*b* that are locally different even within one strip (any one of the strips STR1 to STRn, n is an integer) are disposed. Thus, description provided above with reference to FIGS. 1, 13, and 14 will be omitted or simplified below.

The substrate structure 770 may include the base substrate 772, the unit substrate regions 774*a* to 774*d*, and dummy substrate regions 776. The base substrate 772 may correspond to the base substrates 102, 652, 702, and 752 of FIGS. 1, 12, 13, and 14. The unit substrate regions 774*a* to 774*d* may correspond to the unit substrate regions 104*a*, 104*b*, 654*a*, 654*b*, 704*a* to 704*e*, and 754*a* to 754*d* of FIGS. 1, 12, 13, and 14. The dummy substrate regions 776 may correspond to the dummy substrate regions 106, 656, 706, and 756 of FIGS. 1, 12, 13, and 14.

The plurality of unit substrate regions 774*a* to 774*d* may be arranged on the base substrate 772 in a row direction (X direction) and a column direction (Y direction) and may be spaced apart from each other. The unit substrate regions 774*a* to 774*d* may be arranged in a plurality of strips STR1 and STR2 arranged in at least one of the row direction and the column direction, for example, in the row direction. For example, a size of each of the unit substrate regions 774*a* to 774*d* may be equal to each other. The strips STR1 and STR2 may be spaced apart from each other in at least one of the row direction and the column direction, for example, in the row direction.

The substrate structure 770 includes the unit substrate regions 774*a* (or 774*b*) and 774*c* (or 774*d*) having the pitches P26*a* (or P26*b*) and P27*a* (or P27*b*) that are different according to strips STR1 to STRn (n is an integer). For example, odd-numbered strips STR1, STRn-1 include the unit substrate regions 774*a* (or 774*b*) having the pitch P26*a* (or P26*b*). Even-numbered strips STR2, STRn may include the unit substrate regions 774*c* (or 774*d*) having the pitch P27*a* (or P27*b*).

The substrate structure 770 includes the unit substrate region groups 778*a* to 778*d* including the unit substrate regions 774*a* and 774*b* and 774*c* and 774*d* having the pitches P26*a* and P26*b* and the pitches P27*a* and P27*b* that are locally different within one strip (i.e., one of the strips STR1 to STRn, n is an integer). For example, each of the strips (e.g., the strip STR1 or the strip STRn−1) includes the unit substrate regions 774*a* or 774*b* having the pitch P26*a* or P26*b*. Each of the (e.g., the strip STR2 or the strip STRn) may have the unit substrate regions 774*c* or 774*d* having the pitch P27*a* or P27*b*.

The strips STR1 to STRn (n is an integer) may be divided into a central portion CP and edge portions EP in at least one of the column direction and the row direction, for example, in the column direction. Also, the base substrate 772 may be divided into the central portion CP and the edge portions EP in at least one of the column direction and the row direction, for example, in the column direction.

The pitches P26*a*, P26*b*, P27*a*, and P27*b* between central points of the two adjacent unit substrate regions 774*a* to 774*d* may be different from one another according to portions of the strips STR1 to STRn (n is an integer) or one strip (one of the STR1 to STRn, n is an integer) in one of the row direction and the column direction, for example, in the row direction.

For example, the pitches P26*a*, P26*b*, P27*a*, and P27*b* between the central points of the two adjacent unit substrate regions 774*a* to 774*d* may be greater or smaller than a pitch of the central portion CP or the edge portions EP in the strips STR1 to STRn (n is an integer). Also, the pitches P26*a*, P26*b*, P27*a*, and P27*b* between the central points of the two adjacent unit substrate regions 774*a* to 774*d* may sequentially increase or decrease from the central portion CP (or a central line) to each of the edge portions EP (or an edge line) of the base substrate 772.

The unit substrate region groups 778*a* to 778*d* may be formed by grouping the unit substrate regions 774*a* to 774*d* into groups on portions of the base substrate 772. The unit substrate region groups 778*a* to 778*d* may be each disposed on a portion of one of the strips STR1 to STRn (n is an integer). For example, the unit substrate region groups 778*a* and 778*b* may be disposed on a portion of at least a strip STR2, and the unit substrate region groups 778*c* and 778*d* may be disposed on a portion of at least a strip STRn. In the unit substrate region groups 778*a* to 778*d*, pitches P27*b* between the central points of the two adjacent unit substrate regions 774*c* may be identical. In example embodiments, each of the pitches P27*b* between the central points of the two adjacent unit substrate regions 774*c* may be differently set according to the unit substrate region groups 778*a* to 778*d*.

As described above, the substrate structure 770 includes the unit substrate regions 774*a* (or 774*b*) and 774*c* (or 774*d*) having the different pitches P26*a* (or P26*b*) and P27*a* (or P27*b*), and the unit substrate regions 774*a* and 774*b* and 774*c* and 774*d* having the pitches P26*a* and P26*b* and P27*a* and P27*b* that are locally different even within one strip (any one of the strips STR1 to STRn, n is an integer).

According to the substrate structure 770, warpage of the base substrate 772 or the strips STR1 to STRn (n is an integer) may be reduced or prevented by adjusting a difference in coefficients of thermal expansion of the unit substrate regions 774*a* to 774*d* located on the base substrate 772 or the strips STR1 to STRn (n is an integer) when performing subsequent processes.

Figure 16:
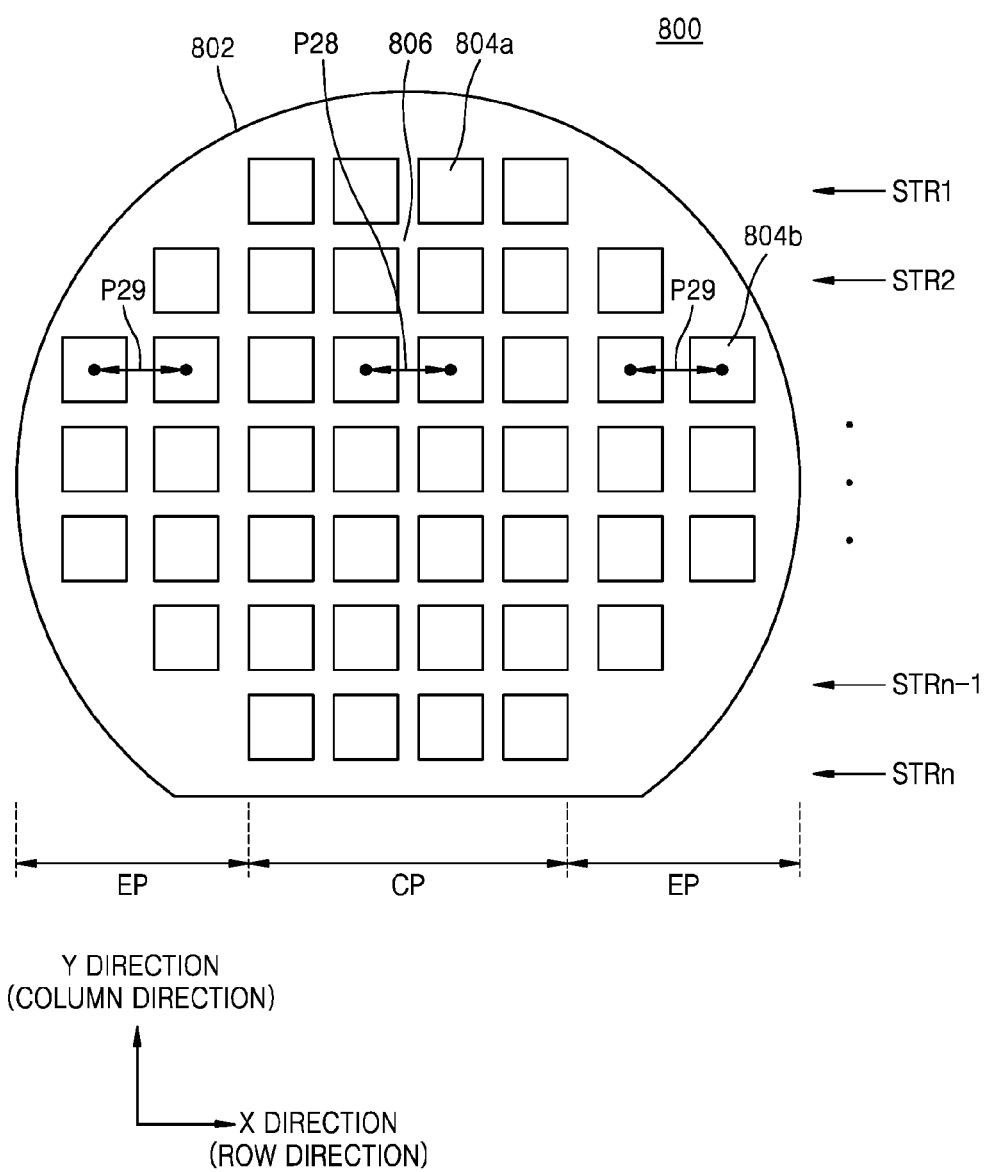
FIG. 16 is a partial plan view of a substrate structure according to an exemplary embodiment of the inventive concept.

FIG. 16 is a partial plane view of a substrate structure 800 according to an exemplary embodiment of the inventive concept.

The substrate structure 800 may be the same as the substrate structures 100 and 250 of FIGS. 1 and 4 except that a base substrate 802 is formed using a wafer. Thus, description provided with reference to FIGS. 1 and 4 will be omitted or simplified below.

The substrate structure 800 may include the base substrate 802, unit substrate regions 804a and 804b, and dummy substrate regions 806. The base substrate 802 may correspond to the base substrate 102 and 252 of FIGS. 1 and 4. The unit substrate regions 804a and 804b may correspond to the unit substrate regions 104a, 104b, 254a, and 254b of FIGS. 1 and 4. The dummy substrate regions 806 may correspond to the dummy substrate regions 106 and 256 of FIGS. 1 and 4.

The base substrate 802 may be a wafer such as a silicon wafer. The unit substrate regions 804a and 804b of the base substrate 802 may be regions where semiconductor chips are formed. The dummy substrate regions 806 may include regions that are cut after the semiconductor chips are formed.

A plurality of unit substrate regions 804a and 804b may be disposed on the base substrate 802. In example embodiments, the plurality of unit substrate regions 804a and 804b may be a plurality of semiconductor chips, for example, memory chips or logic chips. The unit substrate regions 804a and 804b may be arranged on the base substrate 802 in a row direction (X direction) and a column direction (Y direction) and may be spaced apart from each other. The unit substrate regions 804a and 804b may be arranged in a plurality of strips STR1 to STRn (n is an integer) that are aligned in at least one of the row direction and the column direction, for example, the row direction.

The strips STR1 to STRn (n is an integer) of the base substrate 802 may be divided into a central portion CP and edge portions EP in at least one of the column direction and the row direction, for example, in the row direction. For example, the unit substrate regions 804a may be disposed in the central portion CP of the base substrate 802 and the unit substrate regions 804b may be disposed in the edge portions EP of the base substrate 802. In example embodiments, the central portion CP of the base substrate 802 may refer to a portion which includes one or more unit substrate regions 804a disposed symmetrically with respect to and near a central line of the base substrate 802 in a row direction. Each of the edge portions EP of the base substrate 802 may refer to a portion which includes one or more unit substrate regions 804b disposed between one end line of the base substrate 802 and the central portion CP of the base substrate 802 in the row direction. The central line of the base substrate 802 may be located on portions of unit substrate regions 804a or on a portion of the dummy substrate regions 806. Pitches P28 and P29 between central points of the two adjacent unit substrate regions 804a and 804b may be different according to portions of the strips STR1 to STRn (n is an integer) in at least one of the row direction and the column direction, for example, the row direction.

For example, the pitch P28 between the central points of the two adjacent unit substrate regions 804a in the strips STR1 to STRn (n is an integer) may be greater or less than the pitch P29 between the central points of the two adjacent unit substrate regions 804b in the strips STR1 to STRn.

As described above, in the substrate structure 800, the pitches P28 and P29 between the central points of the two adjacent unit substrate regions 804a and 804b may be differently set according to portions of the strips STR1 to STRn (n is an integer) in at least one of the column direction and the row direction, for example, in the row direction.

According to the substrate structure 800, warpage of the base substrate 802 or the strips STR1 to STRn (n is an integer) may be reduced or prevented by adjusting a difference in coefficients of thermal expansion of the unit substrate regions 804a and 804b located on the base substrate 802 and the strips STR1 to STRn (n is an integer) when performing subsequent processes.

Figure 17:
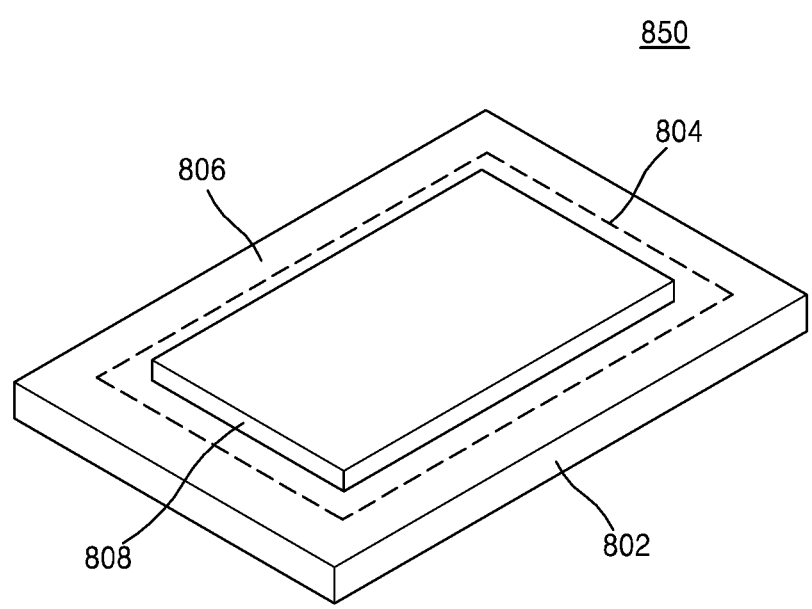
FIG. 17 is a partial perspective view illustrating a substrate module manufactured using a substrate structure according to an exemplary embodiment of the inventive concept.

FIG. 17 is a partial perspective view of a substrate module 850 manufactured using a substrate structure according to an exemplary embodiment of the inventive concept.

The substrate module 850, a semiconductor chip 808 is mounted on the base substrate 802. The base substrate 802 corresponds to a cut portion formed by cutting the substrate structures described above (for example, the substrate structure 102 of FIG. 1). A unit substrate region 804 may be on the base substrate 802. The unit substrate region 804 may correspond to, for example, the unit substrate regions 104a and 104b of FIG. 1.

A dummy substrate region 806 may be around the unit substrate region 804 on which the semiconductor chip 808 is mounted. The dummy substrate region 806 may include a cutting region for forming individual semiconductor chips 808. A circuit pattern layer may be formed in a portion of the dummy substrate region 806. The circuit pattern layer of the dummy substrate region 806 on the base substrate 802 and a semiconductor chip may be electrically connected to each other via a bonding wire. According to necessity, the circuit pattern layer formed in the unit substrate region 804 and the semiconductor chip 808 may be electrically connected to each other in the form of a flip chip. In FIG. 17, a molding layer molding the semiconductor chip 808 is not illustrated for convenience. In addition, an electrical connection member connecting the semiconductor chip 808 and the base substrate 802, such as a bonding wire, is not illustrated.

Figure 18:
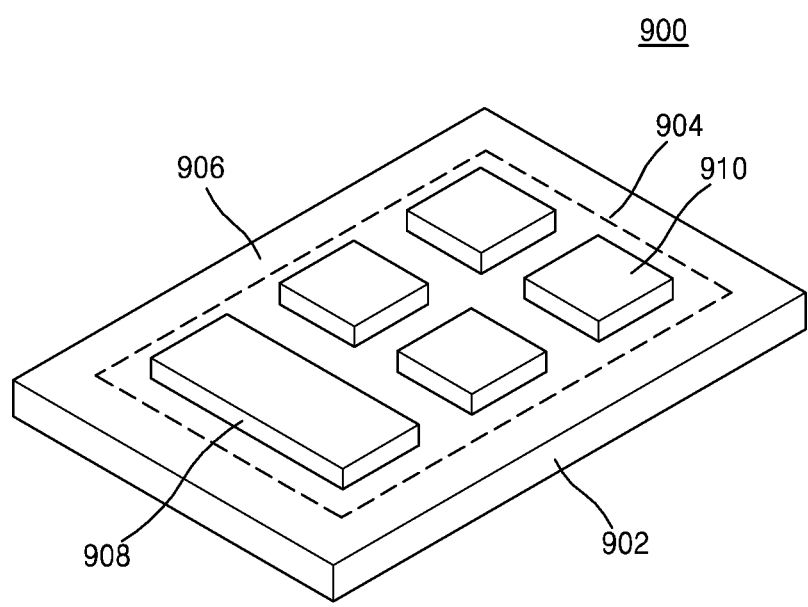
FIG. 18 is a partial perspective view illustrating a substrate module manufactured using a substrate structure according to an exemplary embodiment of the inventive concept.

FIG. 18 is a partial perspective view illustrating a substrate module 900 manufacturing by using a substrate structure according to an exemplary embodiment of the inventive concept.

The substrate module 900, a plurality of semiconductor chips 908 and 910 are mounted on a base substrate 902. The semiconductor chip 908 may be a logic chip, and the semiconductor chip 910 may be a memory chip. The base substrate 902 to a cut portion formed by cutting the substrate structures described above (for example, the substrate structure 102 of FIG. 1). A unit substrate region 904 may be on the base substrate 902. The unit substrate region 904 may correspond to, for example, the unit substrate regions 104a and 104b of FIG. 1.

A dummy substrate region 906 may be located around the unit substrate region 904 on which the semiconductor chips 908 and 910 are mounted. The dummy substrate region 906 may include a cutting region for forming individual semiconductor chips 908 and 910. A circuit pattern layer may be formed in a portion of the dummy substrate region 906. The circuit pattern layer of the dummy substrate region 906 on the base substrate 902 and the semiconductor chips 908 and 910 may be electrically connected to each other via a bonding wire.

In example embodiments, the circuit pattern layer formed in the unit substrate region 904 and the semiconductor chips 908 and 910 may be electrically connected to each other in the form of a flip chip. In FIG. 18, a molding layer molding the semiconductor chips 908 and 910 is not illustrated for convenience. In addition, an electrical connection member connecting the semiconductor chips 908 and 910 and the base substrate 902 is not illustrated.

Figure 19:
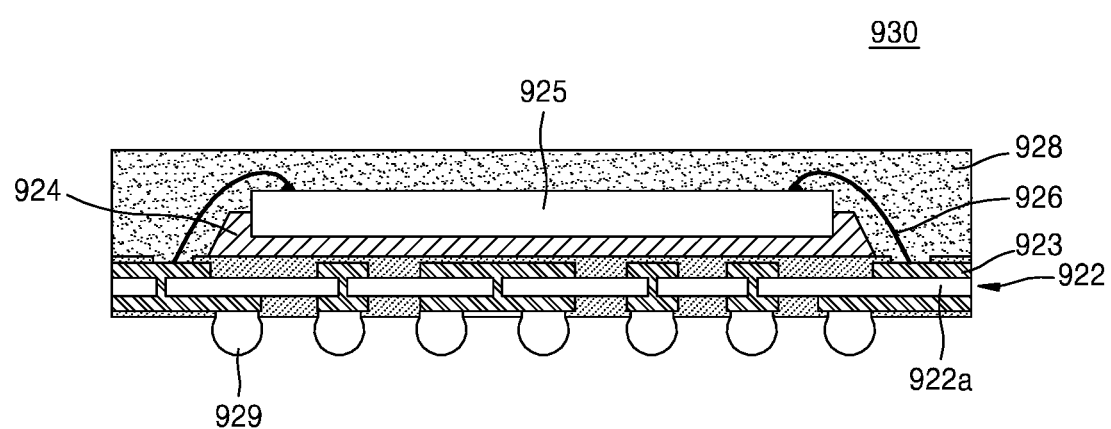
FIG. 19 is a cross-sectional view illustrating a semiconductor package manufactured by using a substrate structure according to an exemplary embodiment of the inventive concept.

FIG. 19 is a cross-sectional view of a semiconductor package 930 manufactured by using a substrate structure according to an exemplary embodiment of the inventive concept.

The semiconductor package 930 may include a semiconductor chip 925 mounted on a base substrate 922, a bonding wire 926 connecting the semiconductor chip 925 and the base substrate 922, and a molding layer 928 molding the semiconductor chip 925.

The base substrate 922 may be a printed circuit board. The base substrate 922 may refer to one cut portion formed by cutting the substrate structures described above (for example, the substrate structure 102 of FIG. 1). Thus, a unit substrate region and a dummy substrate region of a substrate structure may be on the base substrate 922 as described above.

The semiconductor chip 925 may be mounted on the base substrate 922 with an adhesive member 924 therebetween. The semiconductor chip 925 may be a memory chip. The base substrate 922 and the semiconductor chip 925 may be electrically connected to each other via the bonding wire 926. The semiconductor chip 925 and the bonding wire 926 mounted on the base substrate 922 may be encapsulated by using the molding layer 928, which is, for example, an epoxy molding compound.

A circuit pattern 923 insulated by an insulation layer 922a may be formed in the base substrate 922. An external connection terminal 929 that is connected to the circuit pattern 923 and is connectable to an external electronic device or an electronic substrate, such as a solder ball, may be formed on a lower surface of the base substrate 922.

Figure 20:
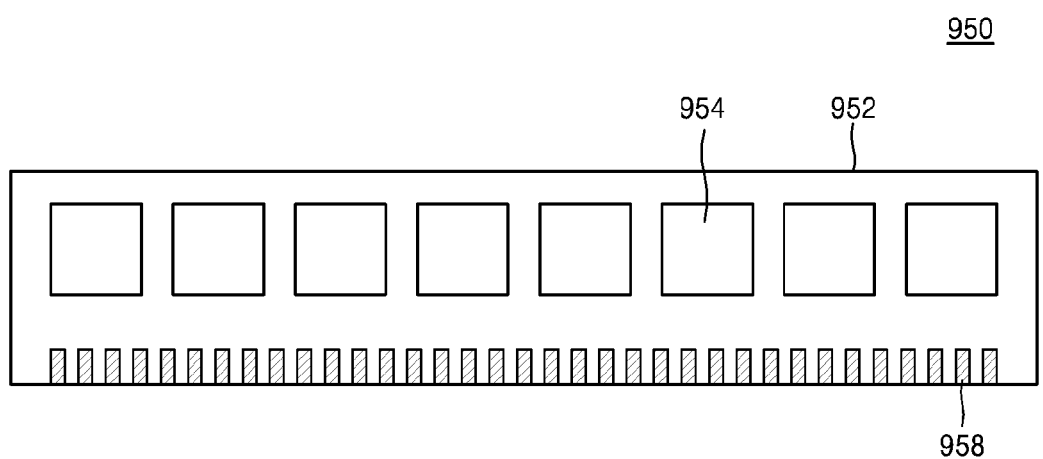
FIG. 20 is a schematic plan view illustrating a semiconductor module including a semiconductor package manufactured using a substrate structure according to an exemplary embodiment of the inventive concept.

FIG. 20 is a schematic plan view of a semiconductor module 950 including a semiconductor package manufactured by using a substrate structure according to an exemplary embodiment of the inventive concept.

The semiconductor module 950 includes a module substrate 952, a plurality of semiconductor packages 954 disposed on the module substrate 952, and module contact terminals 958 formed in parallel to an edge of the module substrate 952 and respectively electrically connected to the semiconductor packages 954.

The module substrate 952 may be a printed circuit board. Both surfaces of the module substrate 952 may be used. For example, the semiconductor packages 954 may be disposed both on upper and rear surfaces of the module substrate 952. While FIG. 20 illustrates that eight semiconductor packages 954 are disposed on the upper surface of the module substrate 952, the exemplary embodiments are not limited thereto. The semiconductor module 950 may further include an additional semiconductor package used to control the semiconductor packages 954.

At least one of the semiconductor packages 954 may be manufactured by using the substrate structures according to the exemplary embodiments of the inventive concept described above (for example, the substrate structure 100 of FIG. 1). The module contact terminals 958 may be formed of a metal, and may be resistant to oxidation. The module contact terminals 958 may be set in various manners according to standards of the semiconductor module 950. Thus, the number of the module contact terminals 958 is not limited to that illustrated in FIG. 20.

Figure 21:
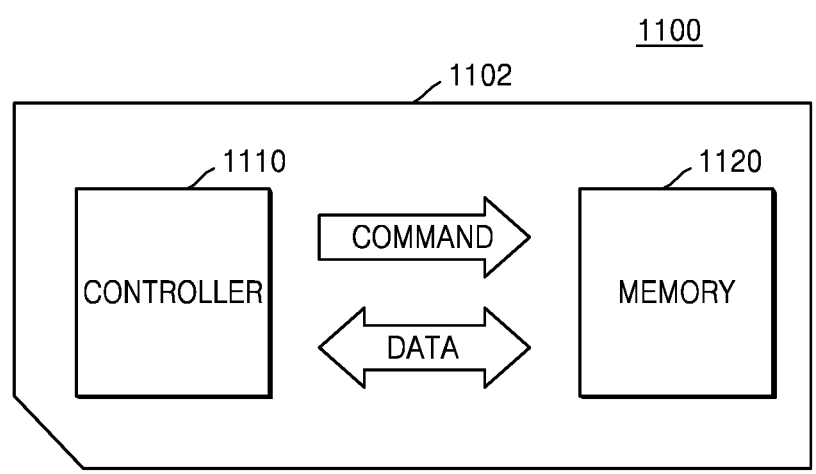
FIG. 21 is a schematic view illustrating a card manufactured using a substrate structure according to an exemplary embodiment of the inventive concept.

FIG. 21 is a schematic view illustrating a card 1100 manufactured by using a substrate structure according to an exemplary embodiment of the inventive concept.

The card 1100 may be arranged such that a controller 1110 and a memory 1120 exchange electrical signals. For example, when the controller 1110 gives a command, the memory 1120 may transmit data. The memory 1120 or the controller 1110 may include a semiconductor package manufactured by using a substrate structure according to the exemplary embodiments of the inventive concept. Examples of the card 1100 may be a memory stick card, a smart media (SM) card, a secure digital (SD) card, a mini-secure digital (SD) card or a multimedia card (MMC).

Figure 22:
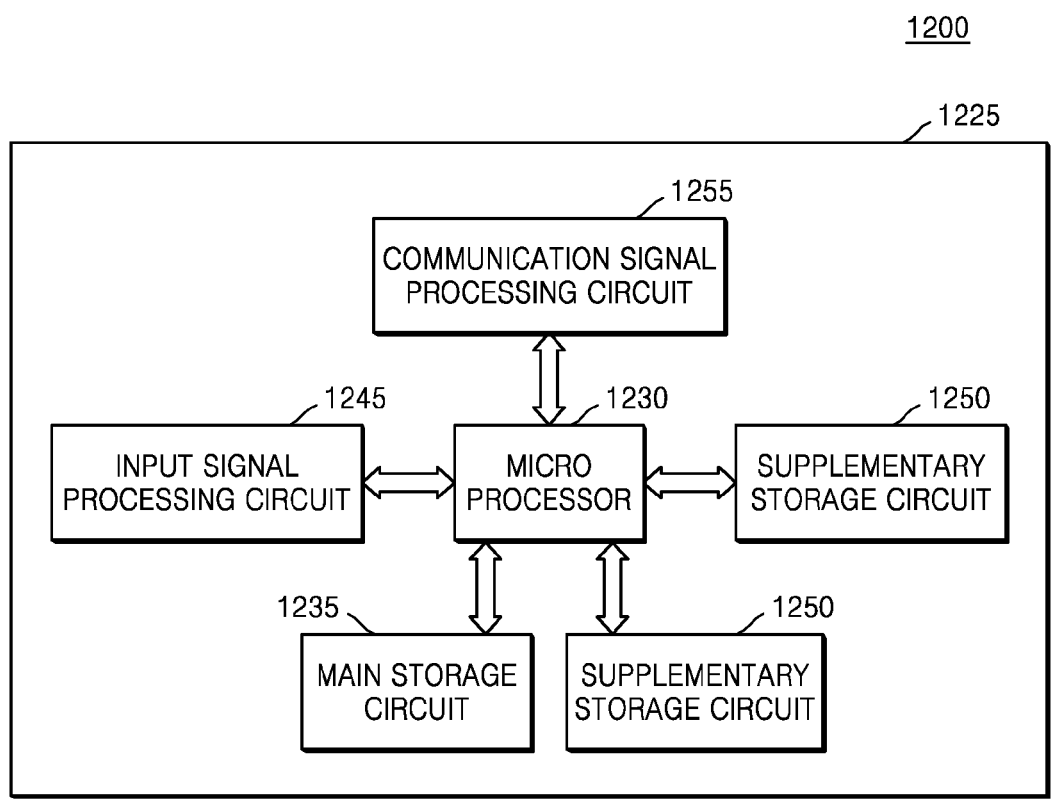
FIG. 22 is a schematic block diagram illustrating an electronic circuit substrate including a semiconductor package manufactured using a substrate structure according to an exemplary embodiment of the inventive concept.

FIG. 22 is a schematic block diagram 1200 illustrating an electronic circuit board including a semiconductor package manufactured by using a substrate structure according to an exemplary embodiment of the inventive concept.

The electronic circuit board 1200 includes, on a circuit board 1225, a microprocessor 1230, a main storage circuit 1235 and a supplementary storage circuit 1240 communicating with the microprocessor 1230, an input signal processing circuit 1245 sending a command to the microprocessor 1230, an output signal processing circuit 1250 receiving a command from the microprocessor 1230, and a communicating signal processing circuit 1255 transmitting and receiving an electrical signal to and from other circuit boards. Arrows may be understood as indicating paths through which an electrical signal may be transmitted.

The microprocessor 1230 may receive and process various electrical signals and output s result of processing, and control other elements of the electronic circuit board 1200. The microprocessor 1230 may be understood as, for example, a central processing unit (CPU) and/or a main control unit (MCU).

The main storage circuit 1235 may temporarily store data that is always or frequently needed by the microprocessor 1230 or data to be processed or processed data. The main storage circuit 1235 requires a fast response, and thus may be a semiconductor memory chip. In detail, the main storage circuit 1235 may be a semiconductor memory called cache, a static random access memory (SRAM), a dynamic random access memory (DRAM), a resistive random access memory (RRAM), and application semiconductor memories thereof such as a utilized RAM, a ferro-electric RAM, a fast cycle RAM, a phase changeable RAM, a magnetic RAM or other semiconductor memories.

In addition, the main storage circuit 1235 may be either volatile or non-volatile memory and may include a random access memory. In the present exemplary embodiment, the main storage circuit 1235 may include at least one semiconductor package or semiconductor module manufactured using a substrate structure according to the inventive concept. The supplementary storage circuit 1240 may be a large capacity memory device, and may be a non-volatile semiconductor memory such as a flash memory or a hard disk drive that uses a magnetic field. Alternatively, the supplementary storage circuit 1240 may be a compact disk drive that uses using light. The supplementary storage circuit 1240 does not require a fast speed compared to the main storage circuit 1235, but may be used to store a large amount of data. The supplementary storage circuit 1240 may include a non-volatile memory device.

The supplementary circuit 1240 may include a semiconductor package or a semiconductor module manufactured using a substrate structure according to the inventive concept. The input signal processing circuit 1245 may convert an external command into an electrical signal or transmit an electrical signal received from the outside to the microprocessor 1230.

The command or the electrical signal received from the outside may be an operation command, an electrical signal to be processed or data to be stored. The input signal processing circuit 1245 may be, for example, a terminal signal processing circuit processing a signal received from a keyboard, a touch pad, an image recognition device or other various sensors, an image signal processing circuit processing an image signal input of a scanner or a camera, or various sensors or an input signal interface. The input signal processing circuit 1245 may include a semiconductor package or a semiconductor module manufactured by using a substrate structure according to the inventive concept.

The output signal processing circuit 1250 may be an element transmitting an electrical signal processed by the microprocessor 1230, to the outside. For example, the output signal processing circuit 1250 may be a graphic card, an image processor, an optical converter, a beam panel card or an interface circuit having various functions. The output signal processing circuit 1250 may include a semiconductor package or a semiconductor module manufactured by using a substrate structure according to the inventive concept.

The communication circuit 1255 is used to directly transmit or receive an electrical signal to or from other electronic system or other circuit board, without passing through the input signal processing circuit 1245 or the output signal processing circuit 1250. For example, the communication circuit 1255 may be a modem of a personal computer system, a LAN card or other various interface circuits. The communication circuit 1255 may include a semiconductor package or a semiconductor module manufactured by using a substrate structure according to the inventive concept.

Figure 23:
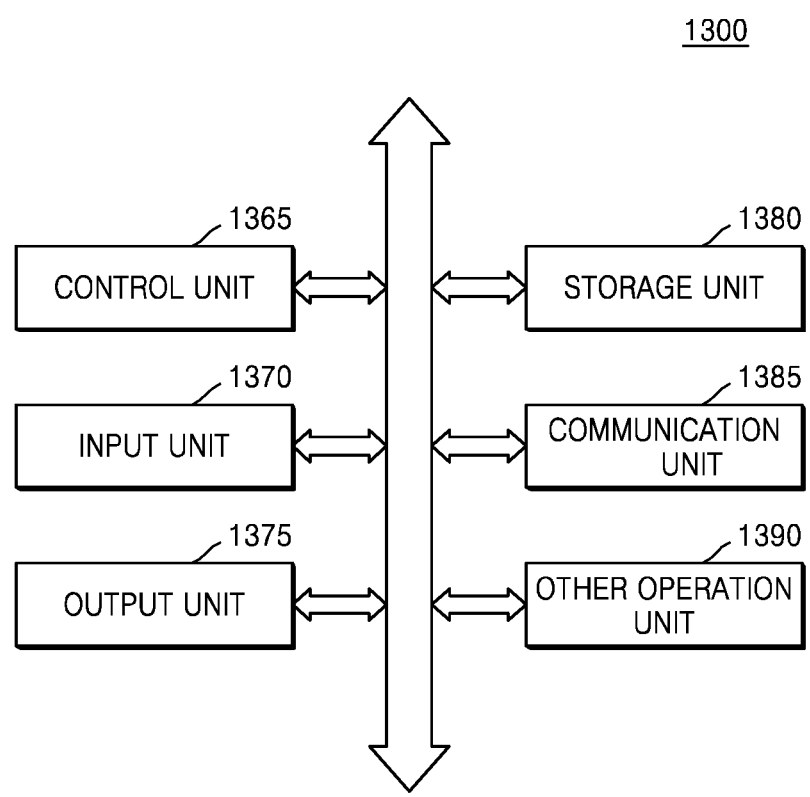
FIG. 23 is a schematic block diagram illustrating an electronic system manufactured using a substrate structure according to an exemplary embodiment of the inventive concept.

FIG. 23 is a schematic block diagram illustrating an electronic system 1300 manufactured by using a substrate structure according to an exemplary embodiment of the inventive concept.

The electronic system 1300 may include a control unit 1365, an input unit 1370, an output unit 1375, and a storage unit 1380, and may further include a communication unit 1385 and/or an operation unit 1390.

The control unit 1365 may control the electronic system 1300 and each element of the electronic system 1300 overall. The control unit 1365 may be understood as a central processing unit or a central control unit, and may include the electronic circuit board 1200 (see FIG. 21) according to an exemplary embodiment of the inventive concept. Also, the control unit 1365 may include a semiconductor package or a semiconductor module manufactured by using a substrate structure according to the inventive concept.

The input unit 1370 may transmit an electrical command signal to the control unit 1365. The input unit 1370 may be a keyboard, a keypad, a touch pad, an image recognizer such as a scanner, or other various input sensors. The input unit 1370 may include a semiconductor package or a semiconductor module manufactured by using a substrate structure according to the inventive concept.

The output unit 1375 may receive an electrical command signal from the control unit 1365 and output a result of processing of the electronic system 1300. The output unit 1375 may be a monitor, a printer, a beam projector or other various mechanical devices. The output unit 1375 may include a semiconductor package or a semiconductor module manufactured by using a substrate structure according to the inventive concept.

The storage unit 1380 may be an element for temporarily or permanently storing an electrical signal that is to be processed or is processed by the control unit 1165. The storage unit 1380 may be physically or electrically connected or coupled to the control unit 1365. The storage unit 1380 may be a semiconductor memory, a magnetic storage device such as a hard disk, an optical storage device such as a compact disk, or other server having a data storage function. Also, the storage unit 1380 may include a semiconductor package or a semiconductor module manufactured by using a substrate structure according to the inventive concept.

The communication unit 1385 may receive an electrical command signal from the control unit 1365 to transmit or receive an electrical signal to or from another electronic system. The communication unit 1385 may be, for example, a wired transmission and reception device such as a modem or a LAN card, a wireless transmission and reception device such as a Wibro interface, or an infrared port. Also, the communication unit 1385 may include a semiconductor package or a semiconductor module manufactured by using a substrate structure according to the inventive concept.

The operation unit 1390 may operate physically or mechanically according to a command of the control unit 1365. For example, the operation unit 1390 may be an element that operates mechanically, such as a plotter, an indicator, or an up/drown operator. The electronic system 1300 according to the inventive concept may be a computer, a network server, a networking printer or a scanner, a wireless controller, a mobile communication terminal, an exchanger, or other electronic element that performs a programmed operation.

In addition, the electronic system 1300 may be used in a mobile phone, a MP3 player, a navigation device, a portable multimedia player (PMP), a solid state disk (SSD) or household appliances.

Figure 24:
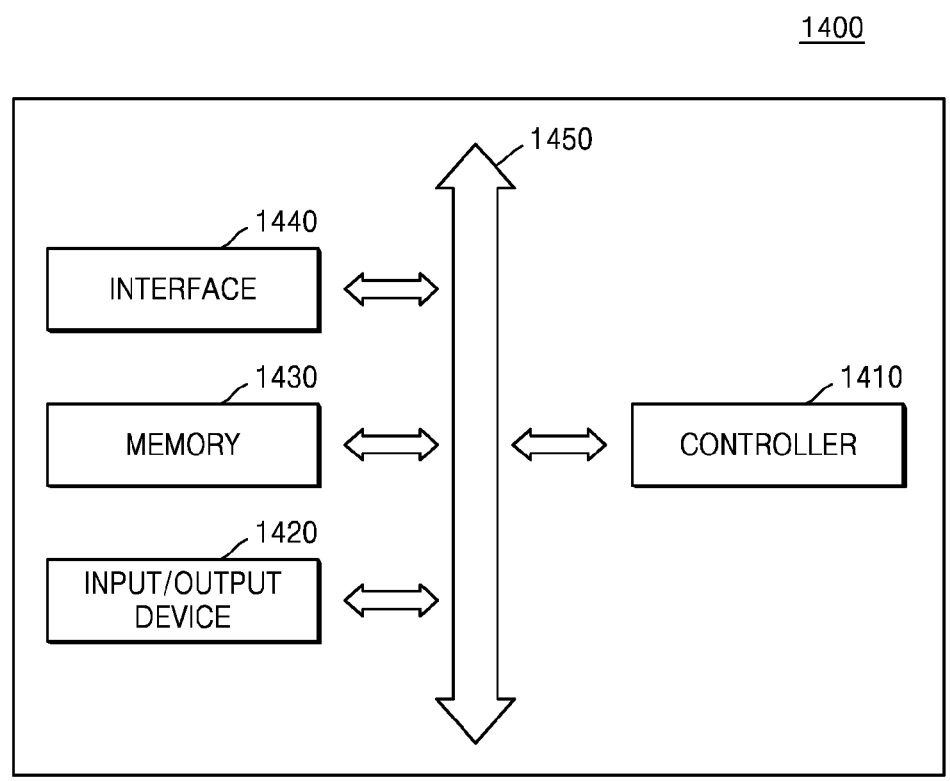
FIG. 24 is a schematic view illustrating an electronic system including a semiconductor package manufactured using a substrate structure according to an exemplary embodiment of the inventive concept.

FIG. 24 is a schematic view illustrating an electronic system 1400 including a semiconductor package manufactured using a substrate structure according to an exemplary embodiment of the inventive concept.

The electronic system 1400 may include a controller 1410, an input/output device 1420, a memory 1430, and an interface 1440. The electronic system 1400 may be a mobile system or a system that transmits or receives information. The mobile system may be, for example, a personal digital assistant (PDA), a portable computer, a web tablet, a wireless phone, a mobile phone, a digital music player or a memory card.

The controller 1410 may execute a program and control the system 1400. The controller 1410 may include a semiconductor package including a substrate structure according to an exemplary embodiment of the inventive concept. The controller 1410 may be, for example, a microprocessor, a digital signal processor, a microcontroller, or a similar device thereto.

The input/output device 1420 may be used in inputting or outputting data of the electronic system 1400. The electronic system 1400 may be connected to an external device such as a personal computer or a network via the input/output device 1420 to exchange data with the external device. The input/output device 1420 may be, for example, a keypad, a keyboard or a display.

The memory 1430 may store codes and/or data to operate the controller 1410 and/or may store data processed by using the controller 1410. The memory 1430 may include a semiconductor package manufactured using a substrate structure according to one of the exemplary embodiments of the inventive concept. The interface 1440 may be a data transmission path between the electronic system 1400 and another external device. The controller 1410, the input/output device 1420, the memory 1430, and the interface 1440 may communicate with one another via a bus 1050.

For example, the electronic system 1400 may be used in a mobile phone, a MP3 player, a navigation device, a PMP, an SSD, or household appliances.

Figure 25:
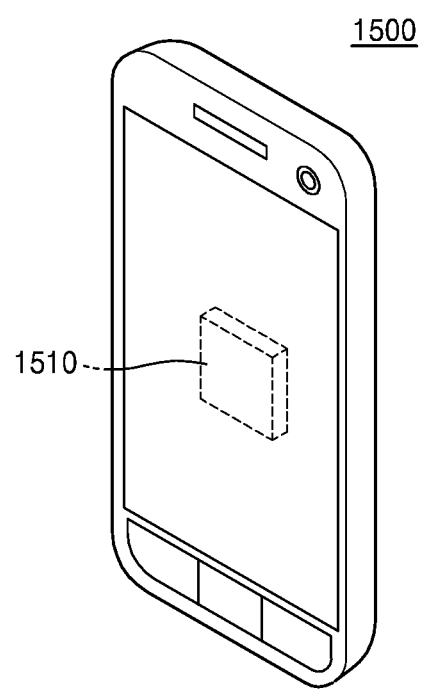
FIG. 25 is a schematic perspective view illustrating a mobile phone manufactured using a substrate structure according to an exemplary embodiment of the inventive concept.

FIG. 25 is a schematic perspective view of a mobile phone manufactured by using a substrate structure according to an exemplary embodiment of the inventive concept.

FIG. 25 illustrates the mobile phone 1500 to which the electronic system 1400 of FIG. 24 is applied. The mobile phone 1500 may include a system on chip 1510. The system on chip 1510 may include a semiconductor package manufactured by using a substrate structure according to the inventive concept. The mobile phone 1500 may include the system on chip 1510, in which a relatively high performance main functional block may be disposed, and thus may have relatively high performance. Also, since the system on chip 1510 may have a higher performance with respect to the same size of area, a size of the mobile phone 1500 may be minimized but the mobile phone 1500 may have relatively high performance.

Figure 26:
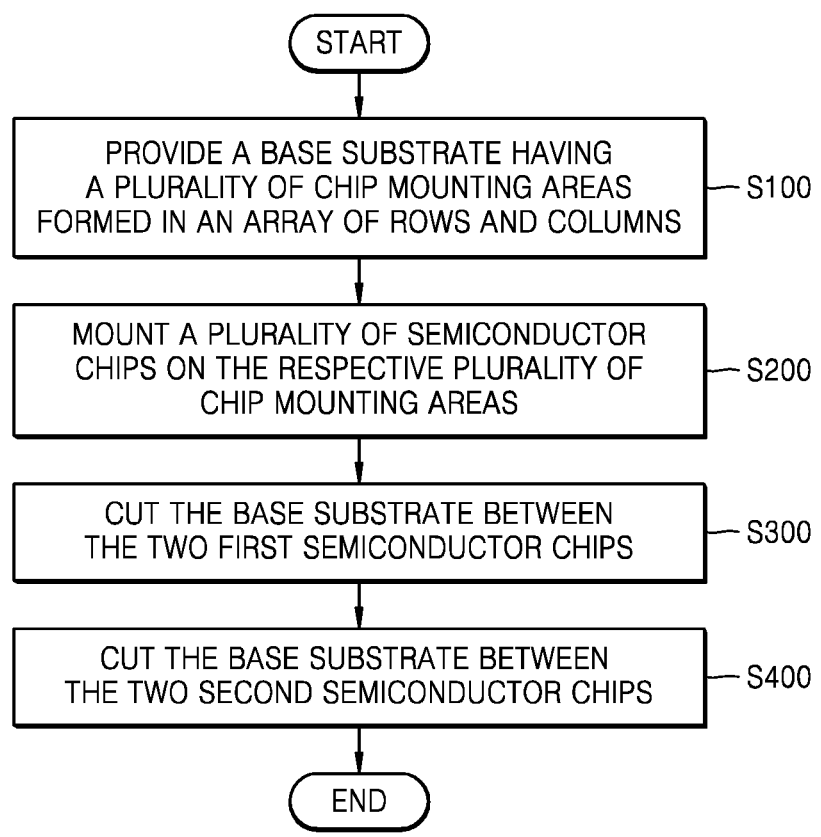
FIG. 26 is a flowchart manufacturing of a semiconductor device according to example embodiments.

FIG. 26 is a flowchart manufacturing of a semiconductor device according to example embodiments.

Though the detailed description of an embodiment including a base substrate with one or more chips mounted thereon is primarily described above, the same concepts described with respect to this embodiment may be applied in manufacturing a plurality of semiconductor chips on a wafer. For example, laser cutting processes described above with respect to the base substrate may be used for unit substrate regions on a wafer, where each unit substrate region is itself a semiconductor chip. Cutting in this case may result in individualized semiconductor chips, rather than individualized packages or base substrate-chip stacks.

During the manufacturing of a semiconductor device, a base substrate having a plurality of chip mounting areas formed in an array of rows and columns according to example embodiments disclosed herein may be provided (S100). A plurality of semiconductor chips on the respective plurality of chip mounting areas may be mounted (S200). Thus, two first semiconductor chips adjacent in a first direction are spaced apart by a first distance in the first direction, and two second semiconductor chips adjacent in the first direction are spaced apart by a second distance in the first direction greater than the first distance. For example, the spacing apart may be based on a distance between adjacent facing edges of the adjacent chips. The base substrate between the two first semiconductor chips may be cut (S300) and the base substrate between the two second semiconductor chips may be cut (S400).

While the present disclosure has been particularly shown and described with reference to exemplary embodiments thereof, it will be understood that various changes in form and details may be made therein without departing from the spirit and scope of the following claims.

What is claimed is:

1. A substrate structure comprising:
a base substrate;
a plurality of unit substrate regions arranged on the base substrate in an array having one or more rows and one or more columns, the plurality of unit substrate regions in each row and column spaced apart from one another; and
dummy substrate regions between the unit substrate regions,
wherein in a row direction, a first pitch between central points of two adjacent first unit substrate regions among the unit substrate regions and a second pitch between central points of two adjacent second unit substrate regions among the unit substrate regions are different from each other, or in a column direction, a first pitch between central points of two adjacent first unit substrate regions among the unit substrate regions and a second pitch between central points of two adjacent second unit substrate regions among the unit substrate regions are different from each other,
wherein sizes of each of the unit substrate regions are equal to each other,
wherein for the array, in the row direction or the column direction, a distance between two adjacent unit substrate regions is smaller than each of the first pitch and the second pitch, and
wherein the dummy substrate regions include a cutting region for forming individual semiconductor chips.

2. The substrate structure of claim 1, wherein a plurality of strips formed of the unit substrate regions are spaced apart from one another in at least one of the row direction and the column direction,
wherein the first pitch repeats in at least a first strip of the plurality of strips, and
wherein the second pitch repeats in at least a second strip of the plurality of strips.

3. The substrate structure of claim 2, wherein the first pitch is disposed in a first portion located in a central portion of the at least one of strips, and
wherein the second pitch is disposed in a second portion located in an edge portion adjacent to the central portion of the at least one of strips.

4. The substrate structure of claim 3, wherein, in the at least one of the strips, pitches between the central points of the two adjacent unit substrate regions sequentially increase or decrease from the central portion to the edge portion of the at least one of strips.

5. The substrate structure of claim 1, wherein the two adjacent first and second unit substrate regions are arranged in at least a first row or at least a first column of the base substrate.

6. The substrate structure of claim 1, wherein the two adjacent first unit substrate regions are arranged in at least a first row or at least a first column of the base substrate and the two adjacent second unit substrate regions are arranged in at least a second row or at least a second column of the base substrate, respectively.

7. The substrate structure of claim 1, wherein the base substrate is a printed circuit board, a wafer or a lead frame.

8. The substrate structure of claim 1, wherein a plurality of slots are formed in the dummy substrate regions.

9. The substrate structure of claim 8, wherein widths of at least two of the slots in at least one of the row direction and the column direction are different from each other.

10. The substrate structure of claim 1, wherein the base substrate is a printed circuit board (PCB), and the unit substrate regions each include a chip mounting area, on which a semiconductor chip is mounted, and the dummy substrate regions each include a cutting region for forming individual semiconductor devices.

11. A substrate structure comprising:
a base substrate;
a plurality of unit substrate regions arranged on the base substrate in an array having one or more rows and one or more columns, the plurality of unit substrate regions in each row and column spaced apart from one another; and
dummy substrate regions between the unit substrate regions, wherein a plurality of strips formed of the unit substrate regions are spaced apart from one another in at least one of a row direction and a column direction, wherein in the row direction, a first distance between two adjacent first unit substrate regions among the unit substrate regions and a second distance between two adjacent second unit substrate regions among the unit substrate regions are different from each other, or in the column direction, a first distance between two adjacent first unit substrate regions among the unit substrate regions and a second distance between two adjacent second unit substrate regions among the unit substrate regions are different from each other, wherein sizes of each of the unit substrate regions are equal to each other, wherein the first distance is smaller than a first pitch between central points of the two adjacent first unit substrate regions, wherein the second distance is smaller than a second pitch between central points of the two adjacent second unit substrate regions, and wherein the dummy substrate regions include a cutting region for forming individual semiconductor chips.

12. The substrate structure of claim 11, wherein the first distance repeats in at least a first strip group including at least two strips, and wherein the second distance repeats in at least a second strip group including at least two strips.

13. The substrate structure of claim 11, wherein, in at least a first strip group including at least two strips, a pitch between central points of two adjacent unit substrate regions in a first portion of the base substrate is greater than or smaller than a pitch between central points of two adjacent unit substrate regions in a second portion of the base substrate.

14. The substrate structure of claim 11, wherein in at least a first strip group including at least two strips, pitches between the central points of two adjacent unit substrate regions increase or decrease from a first portion to a second portion of the base substrate.

15. A substrate structure comprising:
a base substrate; and
a plurality of strips aligned on the base substrate in at least one of a row direction and a column direction and spaced apart from one another, wherein the plurality of strips each include first and second portions, a plurality of unit substrate regions spaced apart from one another, and dummy substrate regions between the unit substrate regions, on the base substrate, wherein a first pitch between central points of two adjacent unit substrate regions of the first portion and a second pitch between central points of two adjacent unit substrate regions of the second portion are different from each other, wherein sizes of each of the unit substrate regions are equal to each other, wherein a first distance between the two adjacent unit substrate regions of the first portion is smaller than the first pitch, wherein a second distance between the two adjacent unit substrate regions of the second portion is smaller than the second pitch, and wherein the dummy substrate regions include a cutting region for forming individual semiconductor chips.

16. The substrate structure of claim 15, wherein the first pitch is disposed in an edge portion of the base substrate and the second pitch is disposed in a central portion of the base substrate, and wherein the first pitch is greater than the second pitch.

17. The substrate structure of claim 15, wherein, in at least one of the strips, pitches between central points of the unit substrate regions sequentially increase or decrease from the first portion to the second portion of the base substrate.

18. The substrate structure of claim 15, wherein a dummy substrate region is disposed between the strips.

19. The substrate structure of claim 18, wherein the unit substrate regions each includes a semiconductor chip mounting area on which a semiconductor chip is mounted.

* * * * *